(12) United States Patent
Abi-Ackel et al.

(10) Patent No.: US 9,903,894 B2
(45) Date of Patent: Feb. 27, 2018

(54) METHOD AND SYSTEM FOR MONITORING A SECONDARY ELECTRIC POWER DISTRIBUTION GRID WITH DETECTION OF FRAUD AND THEFT OF ELECTRIC ENERGY AND PUBLIC LIGHTING DIAGNOSTICS

(71) Applicants: Marcos Valadão Abi-Ackel, Belo Horizonte-MG (BR); Inácio Loiola Pereira Campos, Belo Horizonte-MG (BR)

(72) Inventors: Marcos Valadão Abi-Ackel, Belo Horizonte-MG (BR); Inácio Loiola Pereira Campos, Belo Horizonte-MG (BR)

(73) Assignee: Marcos Valadao Abi Ackel (BR)

( * ) Notice: Subject to any disclaimer, the term of this patent is extended or adjusted under 35 U.S.C. 154(b) by 504 days.

(21) Appl. No.: 14/356,067

(22) PCT Filed: Oct. 26, 2012

(86) PCT No.: PCT/BR2012/000420
§ 371 (c)(1),
(2) Date: May 2, 2014

(87) PCT Pub. No.: WO2013/063669
PCT Pub. Date: May 10, 2013

(65) Prior Publication Data
US 2014/0300210 A1 Oct. 9, 2014

(30) Foreign Application Priority Data

Nov. 3, 2011 (BR) ........................................ 1105842

(51) Int. Cl.
*H01H 47/00* (2006.01)
*G01R 21/00* (2006.01)
(Continued)

(52) U.S. Cl.
CPC ........... *G01R 21/00* (2013.01); *H01H 47/002* (2013.01); *H02J 13/00* (2013.01); *H04Q 9/00* (2013.01);
(Continued)

(58) Field of Classification Search
CPC ...... H04B 10/60; G01J 1/44; G01J 2001/446; G02B 6/4244; G02B 6/4215; G02B 6/4265; G02B 6/4214; G02B 6/4261
See application file for complete search history.

(56) References Cited

U.S. PATENT DOCUMENTS

| 8,159,210 B2* | 4/2012 | de Buda | H04B 3/546 324/103 R |
| 2003/0101008 A1* | 5/2003 | Hart | G01D 4/004 702/57 |

(Continued)

*Primary Examiner* — Jared Fureman
*Assistant Examiner* — Emmanuel R Dominique

(57) ABSTRACT

The present invention relates to a method and system for monitoring the secondary electric power distribution grid with remote fraud and power theft detection, readings, power cuts-off, reconnection and client load control, besides continuous monitoring of the electric grid parameters, providing diagnostics on the status of the grid and public lighting from an assigned Command Central, located at the secondary busbar of the distribution transformer, and Measuring Modules at clients installations.

10 Claims, 20 Drawing Sheets

(51) Int. Cl.
*H02J 13/00* (2006.01)
*H04Q 9/00* (2006.01)
*H05B 37/03* (2006.01)
G01R 19/25 (2006.01)
G01R 22/06 (2006.01)

(52) U.S. Cl.
CPC ....... *H05B 37/034* (2013.01); *G01R 19/2513* (2013.01); *G01R 22/066* (2013.01); *H04Q 2209/40* (2013.01); *H04Q 2209/60* (2013.01); *H04Q 2209/84* (2013.01); *Y10T 307/858* (2015.04)

(56) References Cited

U.S. PATENT DOCUMENTS

2003/0158677 A1* 8/2003 Swarztrauber ......... G01D 4/008
702/62
2007/0055889 A1* 3/2007 Henneberry ....... G01R 19/2513
713/186

* cited by examiner

METHOD AND SYSTEM FOR MONITORING A SECONDARY ELECTRIC POWER DISTRIBUTION GRID WITH DETECTION OF FRAUD AND THEFT OF ELECTRIC ENERGY AND PUBLIC LIGHTING DIAGNOSTICS

CROSS-REFERENCE TO RELATED APPLICATIONS

The present application is a national stage application of PCT Patent Application No. PCT/BR2012/000420, filed Oct. 26, 2012, which claims priority from Brazil Patent Application No. PI1105842-0, filed Nov. 3, 2011, entitled "SYSTEM FOR CONTROLLING, MEASURING AND MONITORING THE SECONDARY ELECTRIC POWER DISTRIBUTION GRID," all of which are incorporated herein by reference in their entirety.

FIELD OF THE INVENTION

The present invention relates to a method and system for controlling, measuring and monitoring the secondary electric power distribution grid with remote fraud and power theft detection, readings, power cut-off, reconnection and client load control, besides continuous monitoring of the electric grid parameters, providing diagnostics on the status of the grid and public lighting from an assigned Command Central, located at the secondary busbar of the distribution transformer, and Metering Modules at clients installations.

BACKGROUND OF THE INVENTION

During the last 100 years the electricity distribution systems evolved by acquiring a stable and safe configuration, providing reliable and low cost energy to support the development of nations around the world. Technologically, however, the power systems have not kept major improvements as occurred in the fields of electronics, telecommunications and computing, carrying essentially the same ideas, forms and the same original problems.

Despite the large capillarity, because the distribution network has to reach every individual residence, the information collected and stored by utilities are relatively sparse. This is mainly due to the lack of low cost and reliable communication from the many end branches of the system.

As an example of the difficulties imposed by the lack of information on the current distribution system, in case of a power outage at a client, the energy distribution company, in almost all cases, has no way to detect the fault unless the client reports the failure, even if the fault is in the distribution network itself. Almost all information available consists of monthly consumption readings performed by a human meter reader, made locally on each client.

Also, in cases of power cut-off for nonpayment and reconnection after payment settlement, the company has to move a vehicle to the client installation to perform these functions. Considering that distribution companies have thousands and even millions of clients, this implies that the costs involved in these operations are quite high.

The need for modernization of power systems has generated global initiatives such as the "Smart Grid", encouraged by DOE—United States Department of Energy, where the emphasis goes through modernization and new technologies mainly by integrating a communication network with the power system. Although there are several technologies available, the biggest problem for its implementation is the huge investment involved, which would only be amortized over several years.

Apart from modernization initiatives, a chronic problem of distribution networks is related to energy losses, which are classified in technical losses and commercial losses.

Technical losses are related to the energy transport in electrical cables and equipment for imposing a resistance to current flow and are therefore related to the laws of electromagnetism, or more specifically, the Joule's law.

Commercial losses are related to the process of commercialization of energy and involve errors in measurement and consumption reading, errors in the billing process and especially frauds and energy thefts. Fraud refers to tampering with energy meters with the goal of reducing the consumption recorded. Thefts are characterized by illegal connections that divert the energy so that it is not registered by the meter.

Commercial losses not only represent lost revenue for utilities, but also a huge loss to society because there is no related tax collection and part of the prejudice is transferred to the energy rate of regular customers, burdening businesses and the population.

According to estimates made by Brazilian National Electric Energy Agency (ANEEL), commercial losses are responsible for about 15% of the total active power purchased by distribution companies, representing a huge loss to society.

This patent intends to make economically viable several important functions for the process of power distribution through a substantial reduction of losses caused by fraud and energy theft. So below, emphasis will be given to this problem.

The most common types of fraud include a wide range of tampering with consumption measurement, such as waging the meter disk via external agent, breaking the meter seal for tamper with the mechanism or electro-electronic part and various other methods often very creative, making their detection difficult by the energy distributor.

Popularly called "cats" (Translator note: slang used in Brazil), energy thefts are usually direct wire-connection on secondary network or on the service drop (cables connecting the utility pole to the box where the energy meter is installed) without any measurement.

The vast majority of patents aimed at reducing commercial losses targets the two main points affected: the power meter and the secondary network, including the service drop, but it is easy to conclude that it would be necessary to use several techniques associated to have effective protection against fraud and energy theft. In fact, the energy distribution companies develop a series of actions aimed at reducing these unlawful practices of electricity subtraction and, despite all efforts, it is clear that the solutions currently in use have proved to be ineffective and, to minimize the possibility of fraud and energy theft by the end users, the techniques and equipment need to be improved.

Analyzing the various documents existing on the subject, the difficulty is perceived.

The following utility models and patents refer to attempts to hinder fraud on energy meter, either by using better meter technology or by making tamperproof boxes that contain the meter:

MU8802110-6—Disposicao em Medidor Eletronico de Energia Eletrica com Tampa Lacrada (Provision at Electrical Energy Metering with Cover Sealed);

MU8402469-0—Disposicao Construtiva Aplicada a Caixa de Medidor de Energia Eletrica com Sistema de Lacre Inviolavel (Constructive Disposal Applied to the Box of Electric Power Meter with System of Inviolable Sealing);

PI0719731-4—Medidor de Energia Eletrica, Compreendendo pelo Menos Um Captador de Medida de Corrente de Tipo Indutiva e Captador Associado (Electric Energy Meter, Comprising at Least One Collector of Current Measure of Inductive Type and Associate Collector);

PI0703743-0—Gabinete de Medidor de Energia Eletrica (Electric Energy Meter case);

PI0104930-5—Medidor de Energia Eletrica Contra-Ativo as Fraudes (Electric Energy Meter Counter-active to fraud);

PI0002109-1—Sistema e Metodo de Deteccao de Adulteracoes/Anomalias em Medidores de Energia Eletrica e Medidor que Utiliza este Sistema (System and Method for Adulterations/Anomalies Detection in Electric Energy Meters and Meter that Uses this System).

None of these solutions, however, prevents the deviation that is made directly from the distribution network, featuring the power theft.

In particular, the document U.S. Pat. No. 5,940,009—"Apparatus and method to detect tampering with an electronic utility" combines, in the same device, a unit of measurement and a remotely controlled breaker. The detection of electricity fraud or theft is based on measuring the voltage on the load side, just after the breaker and also within the meter. This procedure is not effective because the client installation can be easily changed by placing an insulation device, as a contactor, after the meter and before the client load, which makes the developed voltage measurement technique innocuous.

The document PI0202535-3—"Cabo Conc ntrico Baixa Tensao para Circuitos de Distribuicao de Energia Eletrica" (Low Voltage Concentric Cable to Electric Power Distribution Circuits) addresses the problem of making connections directly to the network by using the cable conductors arranged concentrically. If one tries to drill the cable access phases, a short circuit would be caused. However, the use of this cable is restricted to client's service drop, between the utility pole and the client measurement box, due to the cost of the cable and its limited current capacity. Thus, even though its use efficacy in service drops, the problems of direct connection to the secondary network and tampering measurement still remain.

The documents PI0701530-5 ("Metodo e Aparato para Indicar a Ocorr ncia de Furto de Energia Eletrica em Redes Eletricas"—Method and Apparatus to Indicate the Occurence of Electric Energy Theft in Electric Grids) and PI0505261-0 ("Aparato para Inibir o Desvio em Circuitos/Redes de Energia Eletrica"—Apparatus for Inhibit the Bypass in Circuits/Grids of Electricity) follow similar approaches among them, superimposing a DC (direct current) voltage on the circuit. The superimposed voltage is removed by a filter so that the energy can be supplied within legal parameters and thus consumed without restriction. In the first document, the signal is only used to indicate the energy illicit use and in the second case the intention is to make energy unfit for consumption if the filter is not used. These approaches have two major problems. The first relates to the easy way of getting a similar filter for DC signal elimination, thus making energy available. A filter that is not authorized by the company could be easily assembled or stolen from another client installation. The second problem, in the case of making energy unfit for consumption, is that purely resistive devices such as showers, would be unaffected by the superimposed DC voltage, functioning satisfactorily.

The document PI0505840-6—"SAFE—Sistema Anti-Furto de Energia Eletrica" (ASEE—Anti-theft System of Electric Energy) aims to eliminate power theft through two simultaneous current measurements, one before the conventional client meter and the other located on the utility pole. The difference in the measured currents indicates an energy diversion that is signaled by a light emitting diode (LED) on the instrument housing. This device detects the energy theft on the service drop, in other words, between the pole and the meter, but does not detect secondary network energy theft or metering fraud.

The document PI0701290-0—"Sistema de Medicao Centralizada de Energia Eletrica" (Centralised Measurement System of Electric Energy), uses an approach of centralizing all meters in a single box, along with a command center, sealed and installed in the distribution network or in closets. The technique described in this document does not detect energy theft made directly from the cables of the secondary network, since only the service drops and power meters are protected. In addition, customers with higher loads may claim that the electrical losses in service drop, being responsibility of the power company, were being charged directly from him (client) since the measurement occurs before the service drop, which will certainly bring legal and billing settlement issues for utility companies.

The document PI9902611-2—"Processo de Identificacao dos Consumidores Fraudadores em Uma Rede de Distribuicao de Energia Eletrica, Numa Determinada Regiao, e Sistema e Processo de Determinacao da Exist ncia de Condutores Escondidos, Que Nao Passam Por Um Medidor de Energia Eletrica" (Identification Process of Fraudsters Consumers in Electric Energy Distribution Grid, in a Determined Region, and System and Process of Determination the Existence of Hidden Conductor, that do not Pass Through a Electricity Meter), intends to identify the energy fraud or theft through a repetitive procedure of group measuring, followed by shutdown of each individual client and their reconnection, done remotely. After shutdown/restart of all clients, the measured values are analyzed to detect possible deviations. This approach is only feasible for a very small number of customers and presents several problems, such as:

Theft or fraud would be detected only if there is consumption at the time of measurement;

For a real number of customers in a distribution company (thousands/millions) the procedure would be unfeasible because it would require a very long time to test all clients;

The distribution company would have their service continuity index worsened, which could result in penalties imposed by the Agência Nacional de Energia Elétrica—ANEEL (National Agency of Electric Energy—NAEE).

The patent documents U.S. Pat. No. 7,539,581—"System and method for on-line monitoring and billing of power" and U.S. Pat. No. 7,271,735—"System for the remote data acquisition and control of electric energy" as well as the document WO2007139842—"Automated meter reading system, communication and control network for automated meter reading, meter data collector, and associated methods" propose architectures exclusively for remote energy consumption reading and are not directed to the functionality of detecting fraud or energy theft. Similar methods are used for communication between the meters, intermediate units and central processing unit, however, the measurements are not made in order to obtain a phasor sum to detect abnormalities in the circuit, mainly because of the intermediate units do not have any capability of measuring or checking electrical parameters. Furthermore, they do not address the need for safe procedures for network setup operations such as installation, substitution and removal of devices. It is relevant to note that, in case of communication failure, these systems do not provide alternative mode of operation.

The article "Proposta de Sistema de Arquitetura para a Implementacao de uma Smart Grid na Rede de distribuicao em Baixa Tensao"—(Proposed Architecture System for the implementation of a Smart Grid at the Low Voltage Distribution Grid)—(R. C. Gomes, A. L. Printes, C. M. Ramos—III SBSE, Bethlehem Pa., 18-21 May 2010) describes a relatively similar architecture, but uses "Distribution Units (UD)" installed on utility poles to make consumer measurements in a centralized manner, while the present invention dispenses this equipment, allowing to keep the clients' measuring units on their own consuming facility, as currently occurs in almost all low voltage distribution networks, reducing significantly modification and installation costs. This article employs the energy balance technique to attempt to detect fraud and energy theft. This technique is common to other measurement systems available in the market and consists of measuring the active or total energy in a central point, called in this article "Telesupervision Unit (UT)" (corresponding to the Command Central of the present invention) and comparing the measured value with the sum of all measurements in the low voltage circuit. Since energy is the sum (integral) over time of the powers observed, this technique requires an accumulation time, typically a few days or weeks, due to the required resolution, to be able to compare the energy measurements. Despite of this necessary time, observed in all real implementations of this technique, the article claims to allow "the detection, location and quantification of losses, almost instantly," what does not appear feasible in practice. Furthermore, this technique is not suitable to detect differences caused by the public lighting loads, present in almost all low voltage urban circuits, and neither the energy losses in the circuit, making the detection coarse and inaccurate, allowing to detect only the cases where there is massive fraud or theft. Another important aspect is that there is no security procedure to avoid the replacement of irregular meters adulterated in UD's, making the energies sum being consistent with the measurement at UT (except losses and street lights, as quoted), making frauds undetectable.

The U.S. Pat. No. 6,014,089 "Method for transmitting data using a digital control channel of a wireless network", with filling date Aug. 26, 1997 and granted in Jan. 11, 2000, and the article "Configuring and Managing the Large-Scale Monitoring Network: Solving Real World Challenges for Ultra-Low Powered and Long-Range Wireless Mesh Networks" (C. Dugas—International Journal of Network Management, 2005, 15: 269-282) use a device that looks like the Operative Interface Module which acts as a multifunction portable collector to collect, download, upload and adjust data and parameters of the secondary circuit, as many other systems currently available in the market, however it does not have the fundamental function used here, which is to reinforce and ensure the safety of the measuring system in the operations of installation, removal and replacement of Metering Modules or Command Central. The proposed security function for the Operative Interface Module makes the measurement system significantly more robust and less prone to energy fraud and theft.

The U.S. Pat. No. 5,995,911 "Digital sensor apparatus and system for protection, control, and management of electricity distribution systems", with filling date Feb. 12, 1997 and granted in Nov. 30, 1999, has a sensor and system mainly focused on protection and control of three-phase internal distribution networks. Despite of using the name "power distribution systems", the patent refers to internal networks, within private distribution installations, typically industrial, and not the public networks of power distribution companies or utilities. The system described presents several problems related to mitigating fraud losses and energy theft when related to distribution companies' networks, because:

Does not contemplate or include public lighting charges;
Allows installation of tampered sensors or even new illegal sensors without control over them because there is no security procedures for installation, removal and replacement of sensors;
It is applicable only to internal networks and three-phase loads of consumers (typically industrials), while the distribution networks can be mono-, bi- and three-phasic and come with one, two or three phases loads;
Uses synchronizing technique by GPS (Global Positioning System) in each sensor to establish the necessary phasor measurements, making the total system cost very high to be feasible to the typical distribution networks;
Allows measurement of part or subset of the monitored circuit that precludes the detection of fraud and theft on the network, because there is no way to directly compare the measured values of the subset of sensors with the centralized measurement, which covers all the circuits.

OBJECTIVE OF THE INVENTION

The present invention relates to a method and system for controlling, measuring and monitoring the secondary electric power distribution grid with remote detection of fraud and power theft, readings, power cut-off, reconnection and client load control, besides continuous monitoring of the electric grid parameters, providing diagnostics on the status of the grid and public lighting from an assigned Command Central, located at the secondary busbar of the distribution transformer, and Metering Modules at clients installations.

Other specific objectives can be highlighted:
a) From the fraud and energy theft point of view:
Substantial reduction of fraud and theft of energy in secondary distribution network circuits, the rapid notification of its occurrence to the power company, so they can take the appropriate actions;
b) From the meter reading and billing point of view:
Elimination of manual reading processes, which reduces operating costs, errors in measurement readings and the read-billing time cycle;
Elimination of manual processes of cut-off/reconnection, which are now performed remotely, enabling cost savings and greater agility, as well as a reduction in eventual conflicts between client and company's employees;
Possibility of deployment of prepaid models for energy consumption, with remote control of activation-deactivation;
Ability to implement hour-seasonal tariffs;
Ability to control clients' loads, enabling better distribution system demand control;

Possibility of better customer interaction, due to the use of alphanumeric display for communication between client and company;

c) From the distribution engineering point of view:

Improved management and reliability of the secondary distribution network, with continuous monitoring of electrical parameters;

Clients and secondary network monitoring by a Command Central located at secondary busbar of the distribution transformer, with the possibility of direct communication to the distribution company;

Improved management of public lighting services, with deductive monitoring and defect indication;

Improved reliability and continuity of service through faster and more efficient defect point determination and location in the network;

d) From the distribution company corporative point of view:

Improved management model with more accurate information, more updated, more available and with more details about the secondary network and clients;

Improved information about the medium voltage network, through the Command Central located in the secondary busbar of the transformer and, therefore, reflecting the conditions of medium voltage network;

Possibility of modernizing the distribution network, economically supported by the elimination of the prejudice caused by commercial losses;

The deployment of the technology described in this invention provides the ability to effectively deploy the basis for a Smart Grid, with the modernization of the distribution network, association of a telecommunication network to the power grid and control, monitoring and remote measurement of their charges.

In short, the present invention has focus on the detection of energy theft or fraud based on simultaneous measurement of voltage and current phasors at the secondary transformer distribution busbar and at the energy entry point at clients' installations. The phasor sum of all loads—including public lighting loads—on a specific instant of time, must match the value measured in the transformer busbar, removing the expected values for technical losses. Therefore, all clients' energy meters connected to the system should be replaced by Metering Modules described in this invention.

All other specific objectives mentioned above should be achieved through methods and devices conveniently designed to maximize the benefits of their use and that will be employed in this invention to achieve detection of fraud and energy theft.

DETAILED DESCRIPTION OF THE INVENTION

For a better understanding of the present invention, its description is organized as follows:
Components brief description
Communications types
System overview
Components detailed description
Operating procedures:
  Client energy consumption reading
  Online control measurement
  Off-line control measurement
  Online Metering Module installation
  Off-line Metering Module installation
  Metering Module removal, substitution and disposal
  Client cut-off and reconnection
  Secondary distribution network maintenance
  Command Central installation, removal and substitution
  Power failure in the secondary distribution network
Components Brief Description
Physically, the system consists of:
  Metering Module (11) installed at the energy entry point of each client, taking measurements of the installation electrical parameters.

Command Central (2) placed at the distribution transformer (1) secondary busbar, responsible for centralizing and checking the electrical parameters measured and issuing commands to the Metering Modules or specific loads.

Operative Interface Module (15), portable, for use by certified personnel for the various system operating functions, such as installing or removing modules.

Display Module (12) to visualize energy consumption, values, data of interest and any communication with the distribution company. Designed to be installed on each client's facility (14), being an improvement that extends the system functionality.

Base Station (FIGS. 3 and 4) which brings together networks of Command Centrals (2), allowing the creation of cells that establish a hierarchical communication, being a technology that increases system reliability.

Corporative Processing Center (16) located on the energy distribution company or utility, which has a higher processing capacity, direct and high-speed access to the corporative data network, enabling access to corporate databases and systems.

Communication Types

The communication between system components is fundamental to its operation and understanding. So, the used communication types are described below, followed by a detailed description of the components mentioned above.

Figure 1:
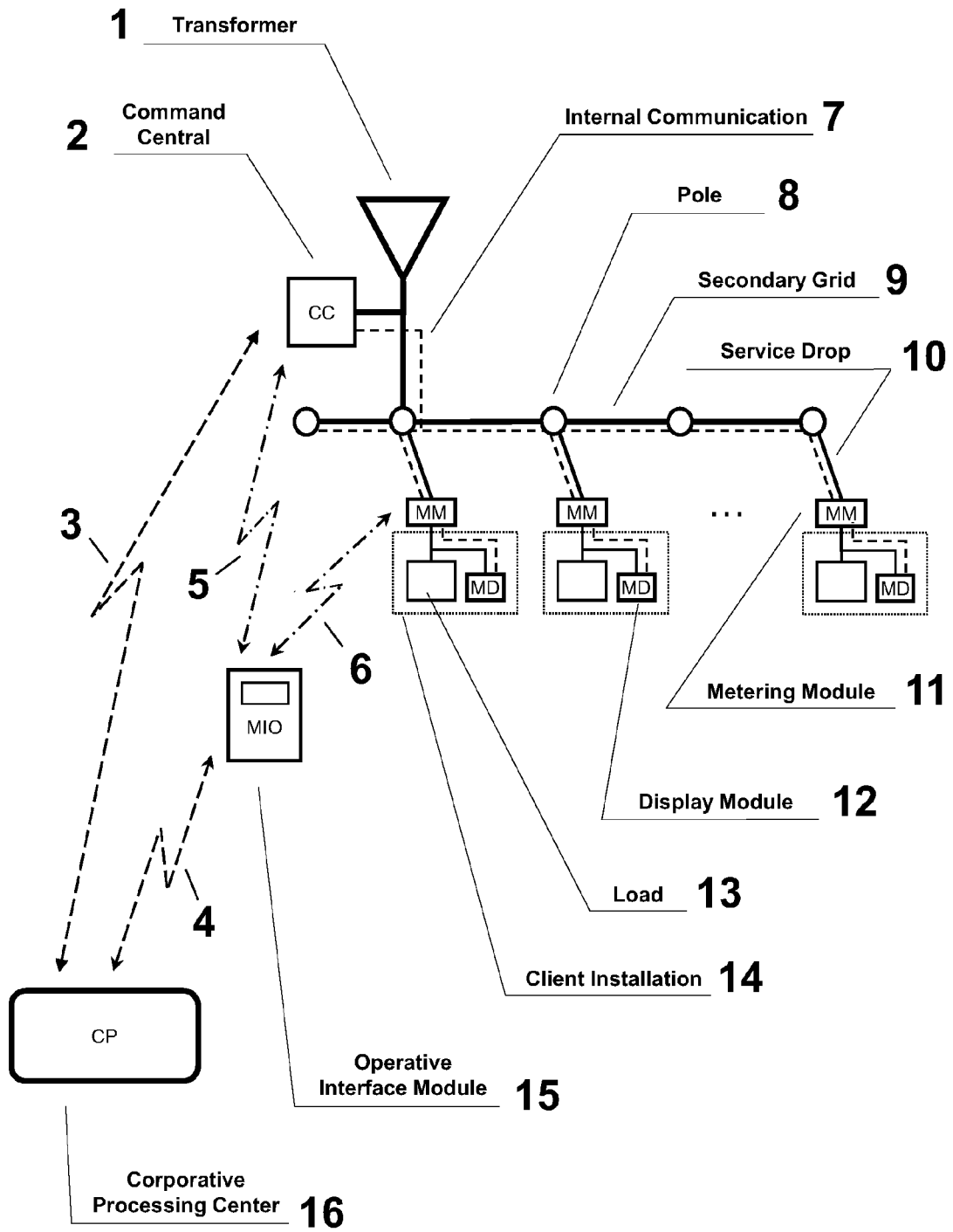
FIG. 1: Simplified diagram of the system overview of the present invention.

Local communication: direct communication at short distances, bi-directional, not necessarily simultaneous, between:

Operative Interface Module and Command Central, represented by (5) in FIG. 1;

Operative Interface Module and Metering Module, represented by (6) in FIG. 1.

It is very desirable that there is no physical coupling, such as connectors or something like that, due to the necessary flexibility and wear of the components that would be frequently used.

Cases with no communication channel between the Command Central (2) and the Corporative Processing Center, are called Local External Communication (5), and made directly in short distance between the Operative Interface Module and the Command Central.

Technological options for local communications are: short-range radio, as Bluetooth and optical communications, such as laser or LED (Light Emitting Diode). All are equally viable, with current technology standards, and the LED use is probably the most affordable option. These represent rather robust options because of the absence of moving parts or physical coupling.

Internal Communications: (7) (internal communication in the secondary network circuit) bidirectional communication between the Command Central, Metering Modules and clients' Display Modules.

Current technological options for internal communication could be: PLC (Power Line Communication) or medium range radio—about a kilometer, as mesh network. The best option would be the use of narrowband PLC, which has effective performance in low-voltage networks, solving in an elegant way the problem of capillarity with low cost. PLC zero-crossing could also be used, with the disadvantage of limited communication speed. The use of mesh network does not emerge as an advisable option because of the occupation of the electromagnetic spectrum by the large number of Metering Modules and communication failures by interference that would be quite common in medium and large cities.

External Communication: (external communication, outside of the secondary distribution network) bi-directional communication for greater distance, not necessarily simultaneous, between:

Corporative Processing Center and the Command Central, represented by (3) in FIG. 1;

Corporative Processing Center and Operative Interface Module, represented by (4) in FIG. 1.

Currently there are several options technologically viable, such as:

Mesh network;

Mobile network data communication, such as GPRS (General Packet Radio Service), EDGE (Enhanced Data rates for GSM Evolution) and 3G (Third Generation);

Radio as TETRA;

PLC for medium voltage (narrowband);

Telephone cables;

Optical Fiber.

For urban areas, the best option would be the use of mesh networks, which would increase the reliability and the independence of the energy distribution company in relation to mobile operators. In addition, it would have a lower final cost compared to options like radio or optical fiber. In areas where there are few secondary circuits close together, as in rural areas, the mobile data network could be used, where available. Regarding reliability, the current stage of development of PLC technology for medium voltage is still very restricting.

The External Communication can be made using different technologies, one for communication between the Corporative Processing Center and Command Central—for example, using mesh network—and another technology between the Corporative Processing Center and Operative Interface Modules—for example, using the mobile phone data network.

The communication between the Corporative Processing Center and Command Central can be made by at least three different ways:

Continuous Connection—or Online, in which both ends are permanently connected, with possible constant communication.

Switched Connection—where the connection is initially established, messages are exchanged, and then the connection is terminated. It has the advantage of being potentially cheaper than Continuous Connection. To simplify the description herein, this connection will also be called Online.

No Direct Connection—or Off-Line, in which the Command Central has no direct communication channel with the Corporative Processing Center. In this case, the Operative Interface Module plays an intermediary role to transfer, collect and load data from the Command Central. Can be made through the Local External Communications, as mentioned on the previous item, Local Communication. The aim in this case is the reduction of communication costs, it may also serve in cases where there is no possibility of having some of the other more effective ways of communication, for example in rural areas.

In all types of communication listed here, relatively small volumes of data are transmitted, in the order of a few kilobytes, requiring relatively slow communication speeds, usually implying just comfort for field operators using the Operation Interface Modules. Speeds of 60 to 100 kilobits per second are sufficient, but these values can be increased significantly with current quoted technologies, without significant increase in cost, enabling better system performance.

An important and highly recommended point especially in the External Communication is the use of security mechanisms for information. Standardized techniques may be used, for example, asymmetric encryption with public and private keys, ensuring the integrity, confidentiality and authenticity of the messages. Even in the case of Local External Communication (or Off-Line), the Command Central and Operative Interface Module, for prudent basis, should use these security techniques because all validations of Metering Modules installation and other operational functions must be properly authenticated and authorized.

System Overview

In a possible embodiment, for a better invention understanding, in FIG. 1, the transformer secondary busbar that feeds the secondary network (9) is monitored in real time by a Command Central (2). For supplying energy to the client, a service drop (10) connects the secondary network, from the utility pole (8) to the Metering Module (11) which in turn is connected to the client load (13). The data monitored by the Metering Module are transmitted to the Command Central by a bidirectional communication channel internal to the circuit, herein referred as Internal Communication (7). In various procedures such as installation, removal or replacement the Metering Module, a portable Operative Interface Module (15) is used. Previously, the Corporative Processing Center (16) loads the Operative Interface Module with the necessary data to carry on these procedures. The Corporative Processing Center may also communicate directly with the Command Central (3) and this with the Operative Interface Module (5) or (6).

Components Detailed Description

The components of this system are described in detail below.

The Command Central (2) is the system's core that coordinates and ensures its proper functioning. In a possible embodiment of this invention it is typically installed at the secondary busbar of the distribution transformer, also called output transformer busbar (17) and can also be incorporated into the transformer design, simplifying installation and maintenance procedures.

Figure 2:
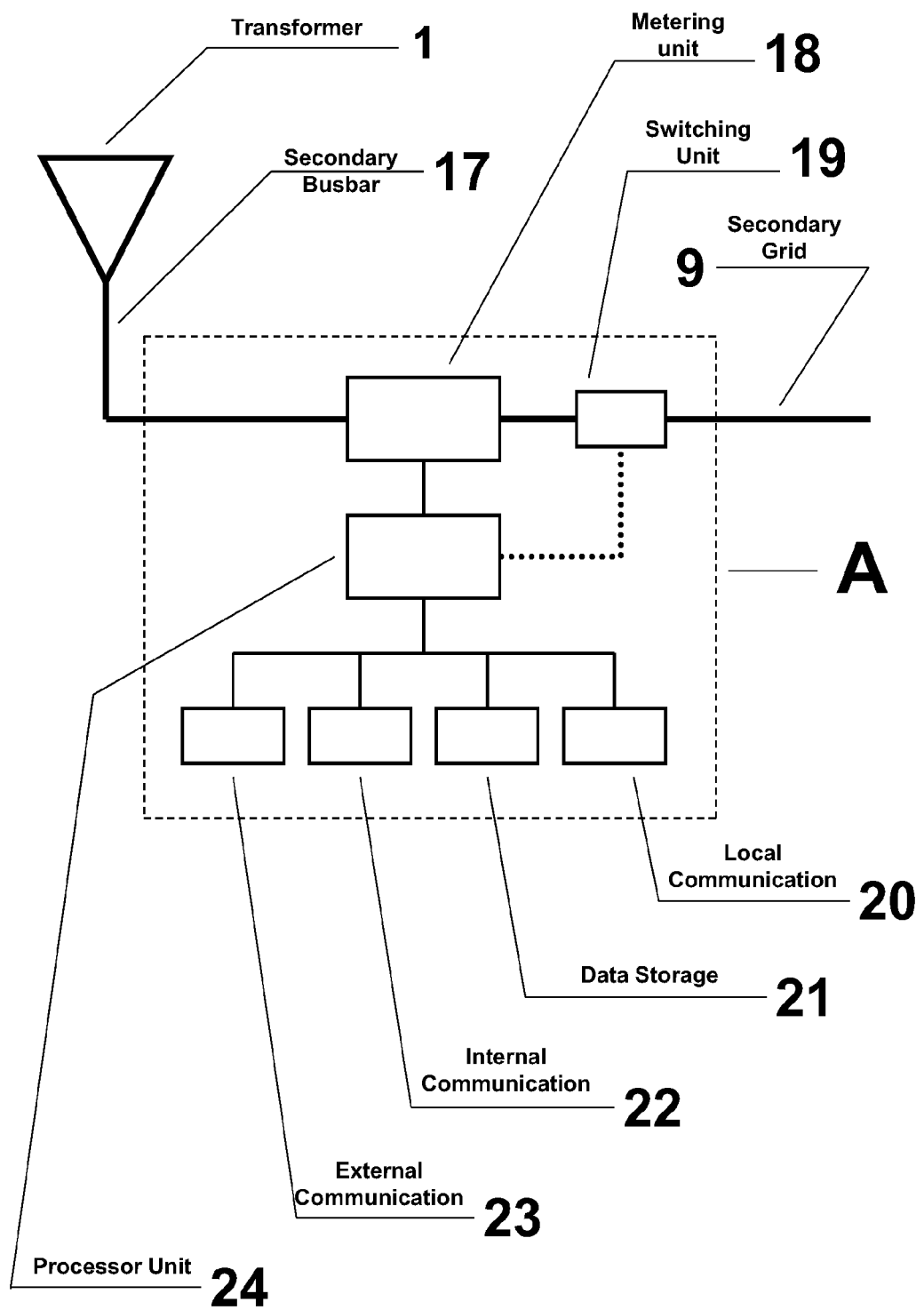
FIG. 2: Block diagram of the Command Central installed at the secondary distribution transformer busbar.

FIG. 2 illustrates a block diagram of the Command Central, outlined by a dotted rectangle represented by the letter "A". In this possible embodiment, the Command Central has the following components:

Metering or measurement unit (18) at the secondary busbar (17) of the transformer (1) for continuous monitoring of network parameters through voltage and current transducers;

Switching unit (19) to turn on/off the secondary network circuit for operations with no-load or low load;

Local communication unit (20), for communication with the Operative Interface Module;

Internal data storage unit (21);

Internal communication unit (22), for communication within the secondary network, with Metering Modules installed on clients;

External communication unit (23) for communication with the Corporative Processing Center;

Processor unit (24), which supervises all the functions of the Command Central.

The Command Central shall be designed for single phase, two phases and three phases, all with the same operating principles.

The Command Central has several features that will be detailed in the respective procedures:

Coordinate, perform and verify the periodic readings of the control measurements (of electrical parameters) of Metering Modules on its secondary circuit, for diagnostics and fraud or theft detection;

Perform diagnostics for indications of fraud or theft on the secondary circuit and the electrical conditions of the secondary network, as indications of voltage levels and loads, the situation of street lighting, as lights off, at night, or on, during the day;

Coordinate and transfer the energy consumption readings from the clients' Metering Modules;

Store, for a specified period of time, all measurements of interest;

Report the diagnostic, control and consumption readings and its own condition to the Corporative Processing Center;

Receive and coordinate commands sent by the Corporative Processing Center, intended for system components, such as individual read commands, secondary network switching, and others;

Receive and coordinate procedures for cut-off and reconnection of customers in the secondary network;

Coordinate and maintain the necessary information of the various activities and operational procedures, such as installation, removal and substitution of Metering Modules;

Perform information security protocols during communications, when needed.

Considering that the Command Central is able to control the cut-off or reconnection of client's Metering Modules, a low cost system can be used to turn off or on the secondary network without the need of a circuit-breaker of high current interruption capacity. To do so, first, the Command Central commands the opening of all interrupter units of Metering Modules, which substantially reduces the currents involved. In sequence, the Command Central operates its Internal Switching Unit (that acts like a circuit breaker). Regarding the reconnection, the same technique is used: first the Command Central commands the closing of the internal Switching Unit and then commands the closing of the Interrupter Units of clients' Metering Modules, which can be done with an instruction diffused simultaneously (in broadcast).

Figure 3:
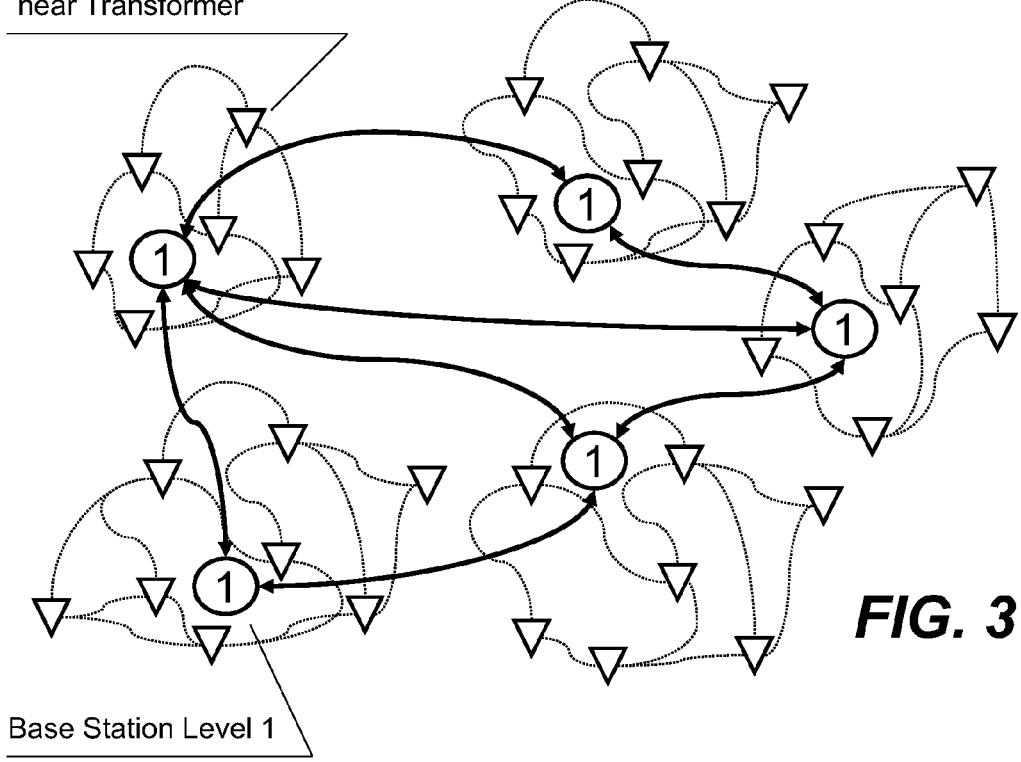
FIG. 3: Representation of interconnection of the Command Central in a mesh network, base stations grouped into Level 1 and the interconnections between these stations.
Figure 4:
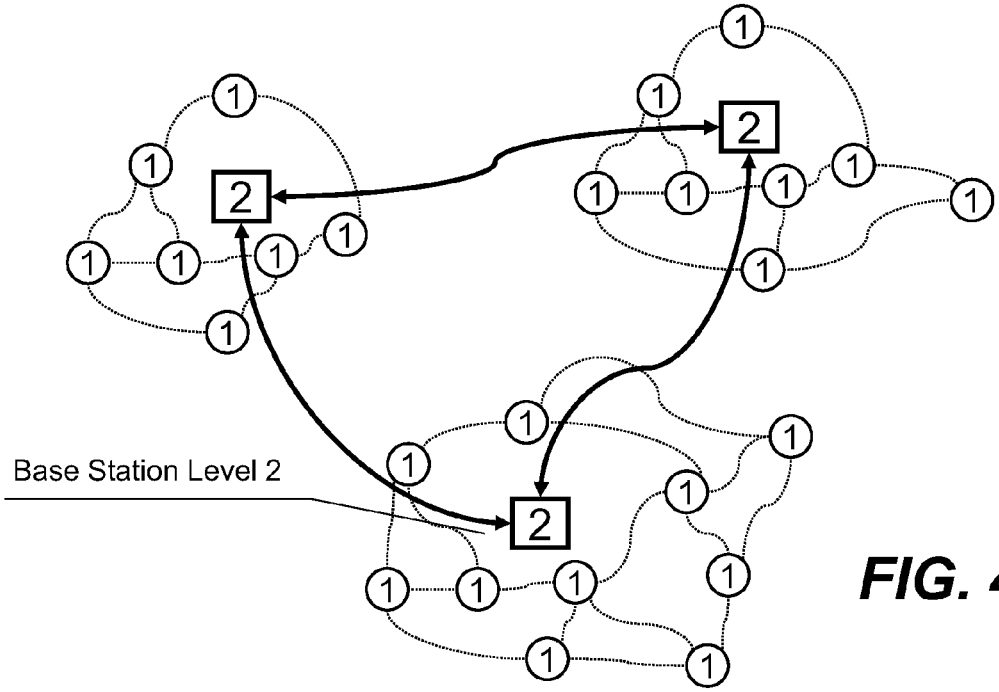
FIG. 4: Representation of interconnection of Level 1 Base Stations, Base Stations grouped into Level 2 and the interconnections between these stations.

When there is a large number of Command Centrals in an area or city, the energy distribution company may opt for a hierarchical communication configuration between the Corporative Processing Center and Command Central, using base stations that gather several Command Centrals, as indicated in FIG. 3. Each base station forms a cell which in turn can be grouped with other cells in another base station of higher hierarchical level, as shown in FIG. 4 and so on, until it reaches a situation of communication technically optimized. This hierarchy of cells allows the energy company to have a better management on the long distance communication points, minimizing costs and optimizing the use of communication channels. This topology is most easily implemented using mesh networks in which a network node called "coordinator" is responsible for making a bridge between two mesh networks or between the mesh network and another different network technology, such as that of mobile phone data network.

Figure 5:
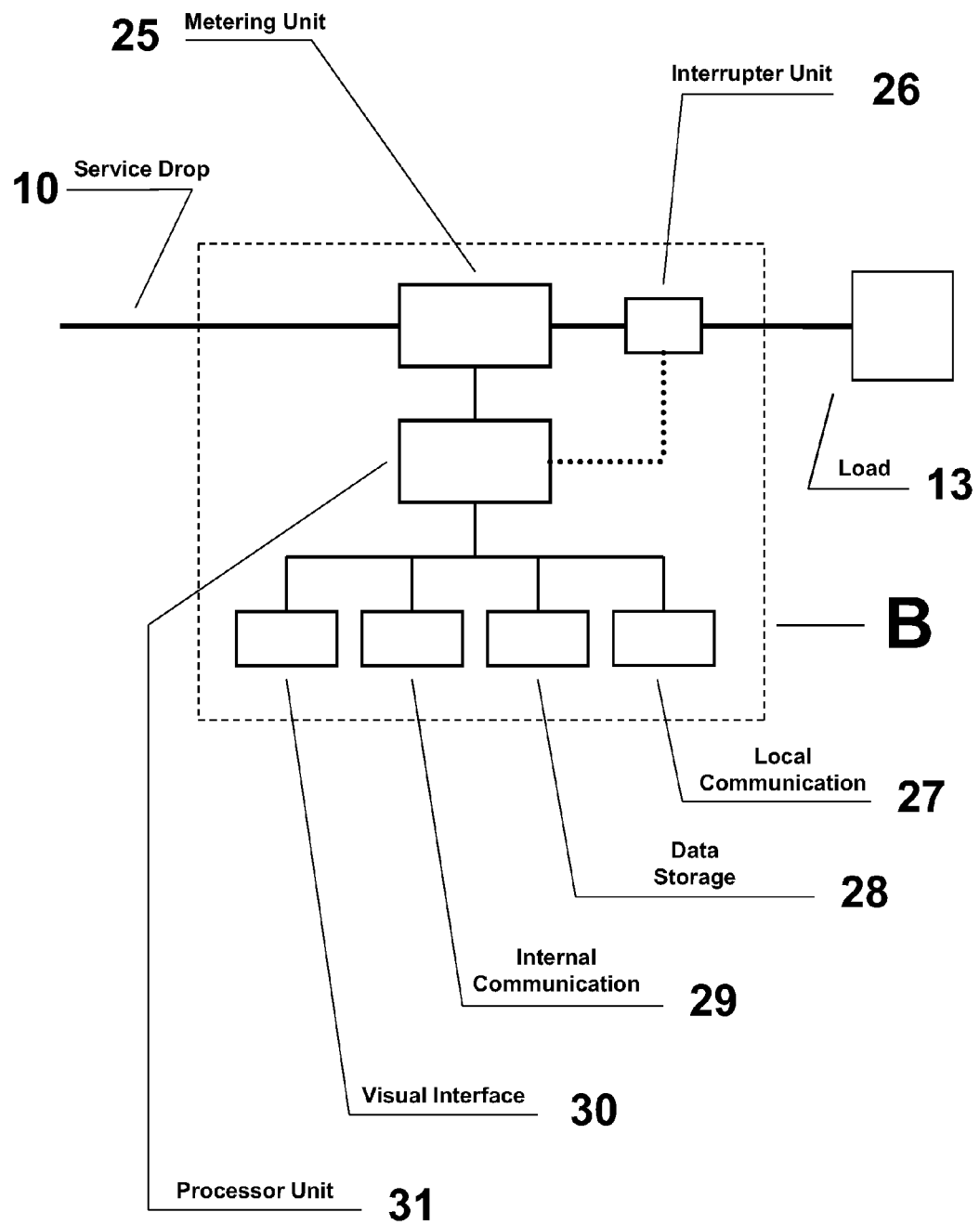
FIG. 5: Block diagram of the Metering Module installed at the client.

The Metering Module is responsible for making measurements of electrical parameters such as voltage, current and energy consumption at the point where the energy is delivery to the client within a minimum precision class determined by legislation. It should be fully encapsulated without access to internal components. In a possible embodiment of the invention, FIG. 5 shows a diagram of the measuring module installed in the client, outlined by a dashed rectangle denoted by the letter "B" having the following components:

Metering (25) for continuous monitoring of electrical parameters of the energy supply.

Interrupter unit (26) for cut-off or reconnection of the customer load (13) and disconnection of the client installation.

Local communication unit (27) with the Operative Interface Module, for specific procedures of installation, removal, substitution, audit, data collection, gauging and other functions.

Data storage unit (28).

Internal communication unit (29), within the secondary network, with the Command Central installed at the secondary busbar of the distribution transformer.

Visual interface (30) for presentation of data and information.

Processing unit (31), which coordinates all functions of the Metering Module.

The Metering Modules should have single phase, two phases and three phases models, all with the same principles of operation.

The Metering Module performs the measurement of active energy, as a conventional meter, storing values internally in non-volatile memory at the data storage unit. Also, takes control measurements, controlled and synchronized by the Command Central, reading voltage, current and angle in phases and neutral, sending these data and/or consumption data to the Central Command when commanded. The voltage and current phasors obtained can be used to compose detailed profiles of several important secondary circuit parameters, including:

Voltage;
Loading;
Phases imbalance;
Technical losses.

The Interrupter Unit, in addition to the electronic operation commanded by the Processor Unit, must also have a mechanical actuator, with visual indication of sectioning for operational security. This allows the customer or electrician to use the actuator to disconnect the energy during services on the internal network at the client's installation. The electronic operation has priority over the manual shutdown, or if it is electronically actuated to open, the manual actuator shall not have effect for closing the Interrupter Unit, ensuring the eventual cut-off situation imposed by the utility company.

To minimize the possibility of frauds, the Metering Module should be completely encapsulated in resin or something similar, to prevent access to its interior, showing only the input and output terminals, the visual interface, the interface for local communication and the lever or manual button actuator of the Interrupter Unit. The encapsulation should be done as to cause damage and disable the electronic circuitry in case of opening attempt.

The Metering Modules must have at least two identification numbers, one external, stamped on the body of the module and easy to read and the other internal, accessible only electronically and uniquely corresponding to the external number. The external number can be recorded as a barcode for easy operating procedures. The correspondence between these numbers is provided by the module manufacturer and should be coordinated so that there are no two Metering Modules with the same internal or external number.

For the implementation of the system object of the present invention, the conventional energy meters currently installed on clients of a secondary network, should be replaced by the Metering Module presented at FIG. 5. All Metering Modules belonging to the same secondary circuit are connected to a single Command Central on a single transformer, and in this circuit the energy readings will be automatic without requiring the presence of a human meter reader. Thus, reading routes in the conventional way, with the presence of a human meter reader, will have to be amended in light of the implementation of this system:

Adjacent conventional reading routes should be made compatible;

The new designed reading routes should not contain the secondary circuits wherein the "Method and System for Monitoring the Secondary Electric Power Distribution Grid with Detection of Fraud and Theft of Electric Energy and Public Lighting Diagnostics", object of the present invention, is implemented.

In cases where the Command Central does not execute direct external communication with the Corporative Processing Center, the human meter reader will read the data stored at the Command Central, through the Local Communication, using the Operative Interface Module, thus, in a single operation it will have the readings of all clients of the circuit.

The Metering Modules can operate without the Command Central, behaving exactly like conventional energy meters, with readings in the visual interface, but with the advantage of allowing the energy reading through the local communication unit.

Figure 6:
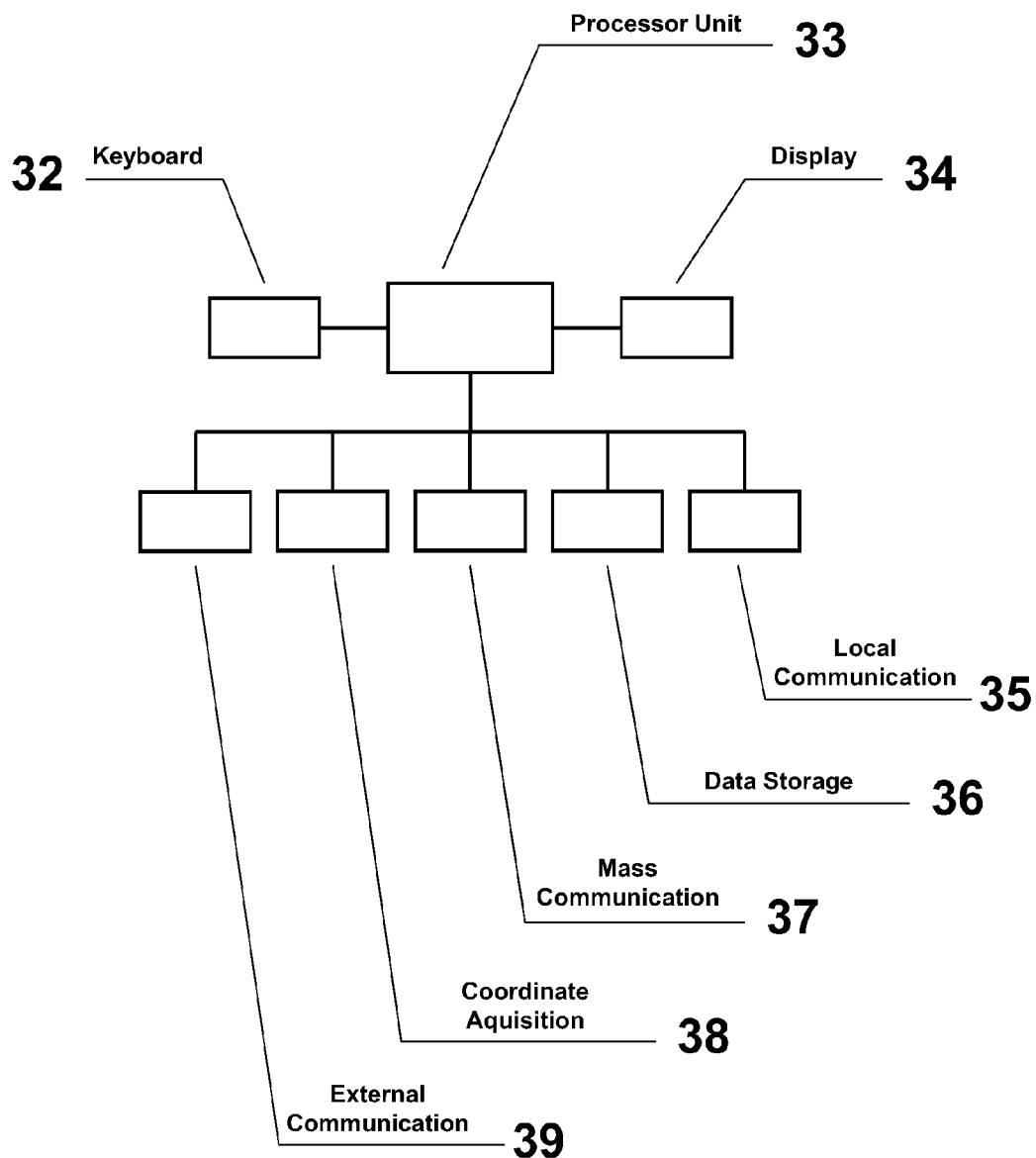
FIG. 6: Block diagram of Operative Interface Module.

In a possible embodiment of the invention, FIG. 6 illustrates a schematic Operative Interface Module used for specific procedures like installation, removal, substitution, auditing, data collection and location of energy fraud and theft during inspections. This module will be used by duly accredited and authorized personnel of the energy company. In this possible embodiment, the following components are present:

Keyboard (32) for data entry by the operator;

Processing unit (33), which coordinates all functions of the Operative Interface Module;

Display (34) for presentation of data and information;

Local communication unit (35);

Data storage unit (36);

Mass communication unit (37);

Satellite Geographic Coordinates Acquisition unit (e.g. GPS—Global Positioning System) (38);

External communication unit (39).

The mass communication unit (37) is used for loading/unloading data to/from the Operative Interface Module. Among the various possibilities of mass communication are noteworthy: USB (Universal Serial Bus), Bluetooth, secure connection over wireless Wi-Fi or Ethernet connection at the local network, within the power company facilities. It is desirable to consider a high speed channel to expedite the data transfer, which, depending on the implemented architecture, can consist of numerous Metering Modules and/or Command Centrals.

In a possible embodiment of the invention, the power company may optionally offer to the client a Display Module capable of several functions:

Display the current power consumption, since the last reading or billing, the last monthly consumption, average consumption, instantaneous demand and other electrical parameters of interest;

Show warnings from the power company concerning clients, as warnings of power cut-offs, programmed power outage and others;

If there is a keyboard available on the unit, the client can establish simplified two-way communication, for example, to accept or hire special rates or request services.

Figure 7:
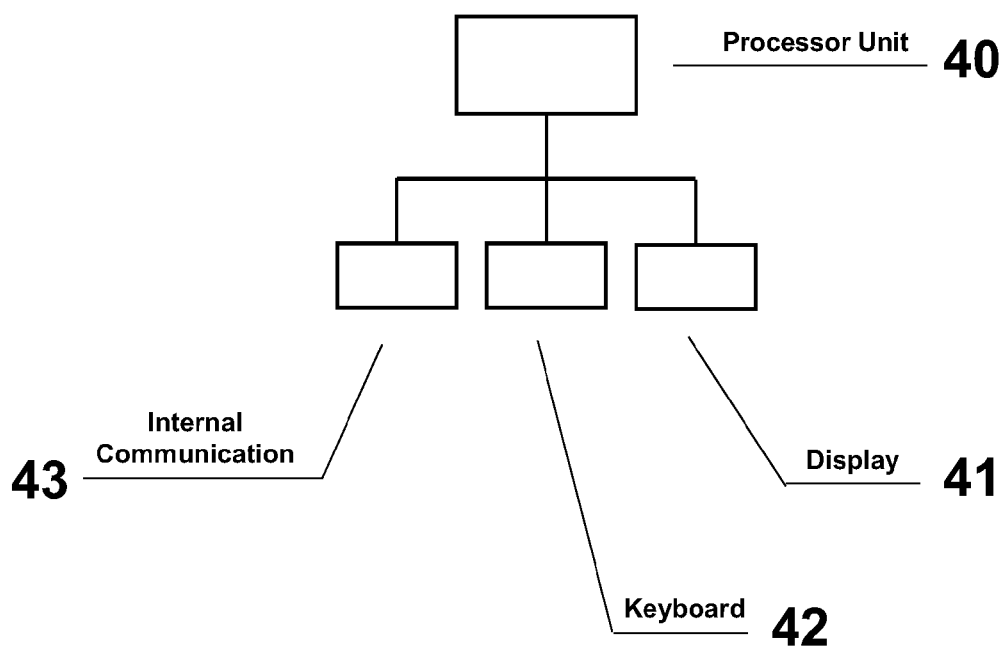
FIG. 7: Block diagram of the Display Module of the client.

The Display Module in a possible embodiment, shown in the block diagram in FIG. 7, consists of the following components:

Processor unit (40), which coordinates all functions of this module;

Display (41) to present data and information;

Keyboard (42), which would increase the functionality of the module;

Internal communication unit (43) for data receiving and possibly data transmission.

Operating Procedures

To obtain the best performance of the system, components must operate in an integrated manner according to operating procedures designed to increase the security and effectiveness of the system. In one possible embodiment of the present system, its main procedures for basic operations are described below.

Figure 8:
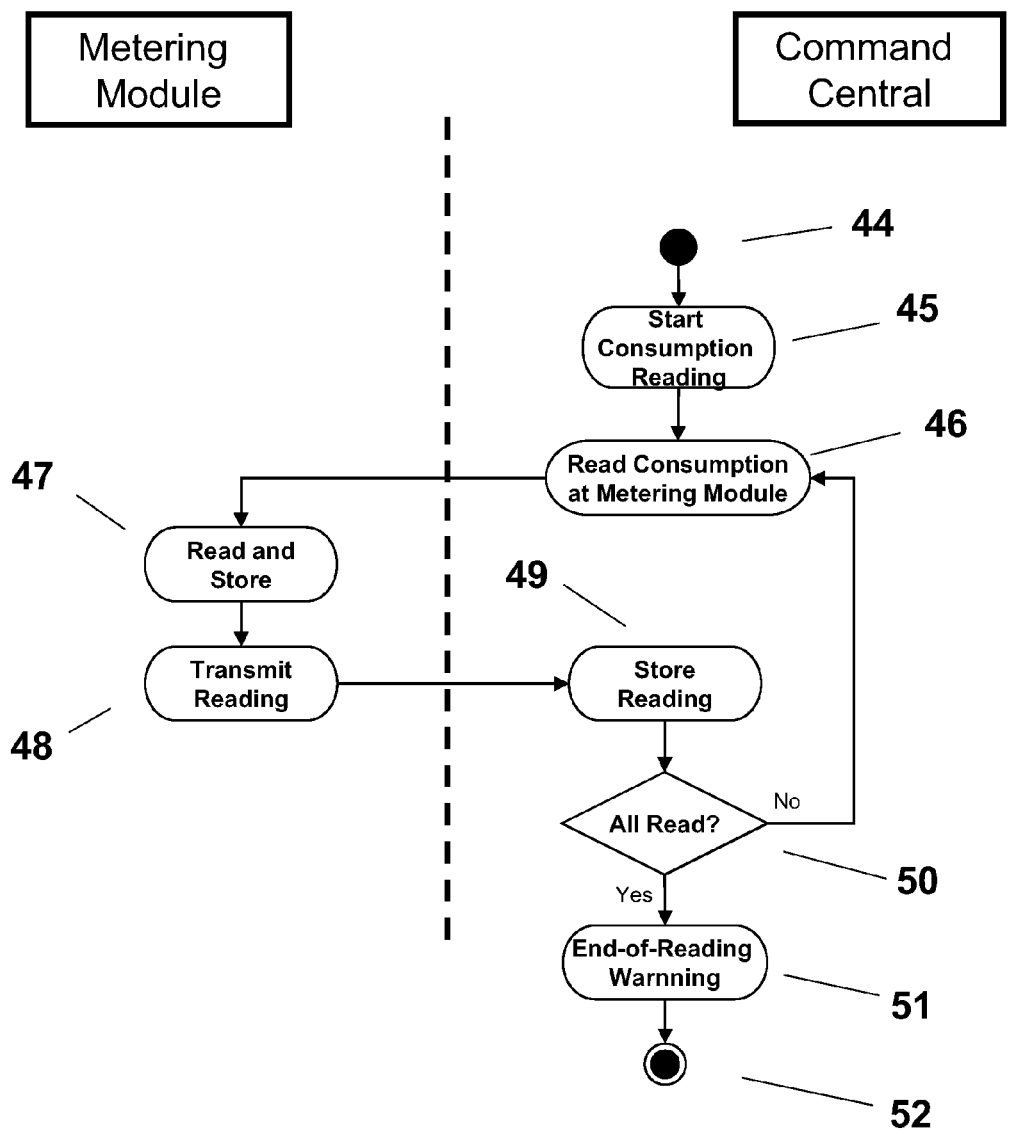
FIG. 8: Flow diagram for the procedure of Consumption Reading of clients.

FIG. 8 illustrates, in a possible embodiment of the present invention, a flow diagram for the procedure of Client Energy Consumption Reading on the circuit. The consumption reading value will be used by the power company to issue the energy invoice to the customer. There are two situations to consider, when the Command Central has direct communication with the Corporative Processing Center and when it does not. When there is communication, the Corporative Processing Center sends directly to the Command Central the command to perform the consumption reading. When there is no direct communication, the Command Central receives a command from an Operative Interface Module to transfer data directly through the local communication unit, or through any Metering Module, by its internal communication unit. Thus a human meter reader can perform all the readings from any point of the secondary circuit at any point where there is an accessible Metering Module. An alternative would be to load in the Command Central date and time schedules for the next energy consumption readings, which would be available at any time for later transfer.

Once the command to perform consumption reading is received the following activities occur, as shown in the flow diagram on FIG. 8:

For each Metering Module registered in the Command Central:
Command Central sends a read command for energy consumption reading to the Metering Module (46);
Metering Module reads the current accumulated energy consumption, adds date and time stamp and stores this data in its storage unit for future references (47);
Attaches its internal identification number to the data and send them to the Command Central (48);
Command Central receives, validates and stores the data on its storage unit (49);

After reading all registered Metering Modules, the Command Central issues a warning of consumption data available to the same communication unit which received the energy consumption reading command (51).

Energy consumption data readings are stored by a time period or number of readings determined by the power company ensuring the existence of a local history. The dataset is then available to be transferred following a send command. This command can be issued in the same way that was issued the consumption reading command, which is directly and remotely from the power company or through local or internal communication units.

To ensure information integrity and minimize fraud incidence, encryption techniques must be implemented in communications between the Command Central and Metering Modules, as well as between the Command Central and the Corporative Processing Center or the Operative Interface Module.

Figure 9:
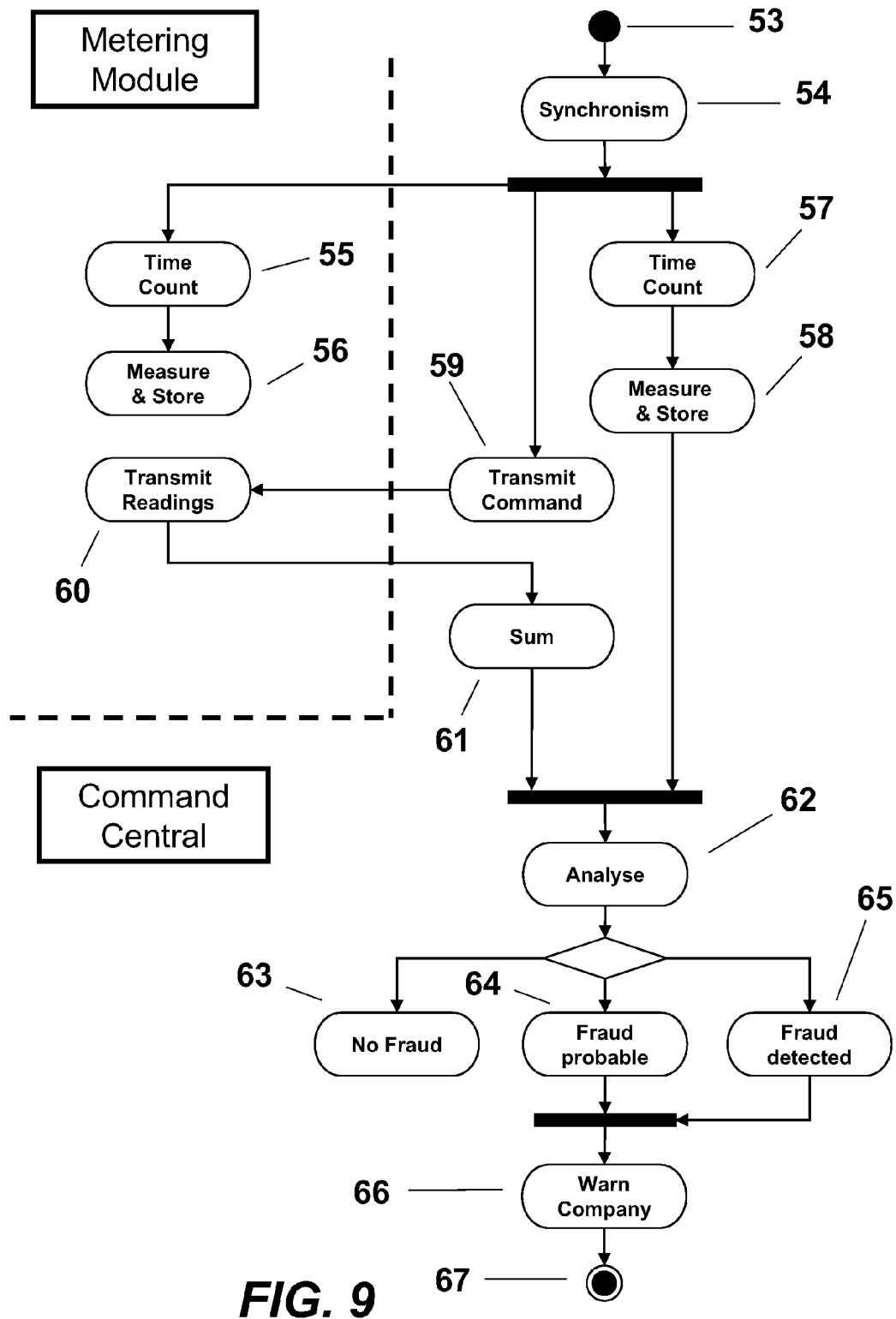
FIG. 9: Flow diagram for the procedure of Online Measurement Control.

FIG. 9 illustrates, in a possible embodiment of the present invention, a flow diagram for the Online Control Measurement procedure used for monitoring the secondary circuit and detecting fraud and energy theft. This procedure applies to cases where there is direct communication between the Command Central and the Corporative Processing Center.

The procedure can be started automatically, triggered by time control or direct command. Depending on the internal communication speed, the procedure can be repeated every few minutes with a frequency determined by the power company. The direct command can be send by the Corporative Processing Center or by an operator through the Operative Interface Module, for example, in an inspection for fraud or energy theft detection.

After the start command for the Control Measurement procedure (53), a synchronization signal is sent (54) simultaneously to all Metering Modules. To ensure the effectiveness of the metering system, it is of fundamental importance that all readings are performed at the same instant of time so that the measured values can be confronted with the measurements taken by the Command Central at the same instant of time. This feature of the present invention represents an advance in the state of the art, for the measurement, comparison and communication with all metering devices are synchronized and made in real time. When the synchronism signal is transmitted, the Command Central starts counting a time interval (57), as the number of cycles, for example, which has the advantage of using the actual voltage waveform as an accurate time synchronism signal. Likewise, all Metering Modules count the same time interval (55). Finished this count, the Command Central performs the measurement (58) as well as the Metering Modules (56). The Command Central then starts to coordinate the measured values transmission from the Metering Modules (59). Once the transmission is finished, the Command Central performs the phasor sum of the measured values by the Metering Modules (61). Having the value of this sum the Command Central processing unit performs an analysis (62) based on the values measured at the transformer secondary busbar (58), also taking into account the estimated values for losses in the network, depending on the measured currents, and the power values of registered public lighting spots. This analysis shows, among others, several possible states:

No fraud (63);
Probable fraud (64);
Fraud detected (65);
Public lighting with burned-out lamp;
Public lighting with lamp turned on during daytime;
Phase failure;
Lack of energy in part of the secondary network.

Items of remote diagnostic for public lighting, phase failure and lack of energy are new features made possible by the use of the present system.

The analysis of the difference between measurements takes into account technical criteria of the power company which establishes a percentage of maximum difference allowed to consider a fraud situation. However this percentage may be changed over time due to the self-learning system that, representing the state of the art, may include hour-seasonal change criteria that can make possible, including, the detection of burned-out or permanently turned-on lamps on the public lightning system of the secondary circuit. Furthermore, because of the robustness of the system, it is possible to detect phase failure and lack of energy in part of the secondary distribution circuit. Regarding the state of the system, the power company will be warned (66) by a hierarchical warning. In events like fraud detection, probable fraud, public lighting problems and others, the event details will be included in the warning so that necessary measures can be taken. After issuing the system state warning to the power company this diagram is ended (67).

As data from the last Control Measurements are stored and available, the power company may choose to transmit all relevant data to perform a detailed analysis on its Corporative Processing Center, where there is more available processing capacity and possibility of data comparison to enterprise systems, thus providing a more accurate diagnosis.

In case of off-line configuration, where the Command Central has no direct communication with the Corporative Processing Center, the Off-line Control Measurement procedure is essentially the same as the online procedure previously described. The differences are only in the process beginning, in which the company must set intervals for the automatic procedure execution, for example every 10 minutes, and the results are stored in the Command Central and are unloaded to the Operative Interface Module whenever there is a connection between them available, typically performed in a monthly basis when carrying out the Consumption Reading procedure. Another possibility in the case of switched communication would be to read the Control Measurement data daily—the company establishes contact with the Command Central and commands stored data transmission, disconnecting after finished.

Figure 10A:
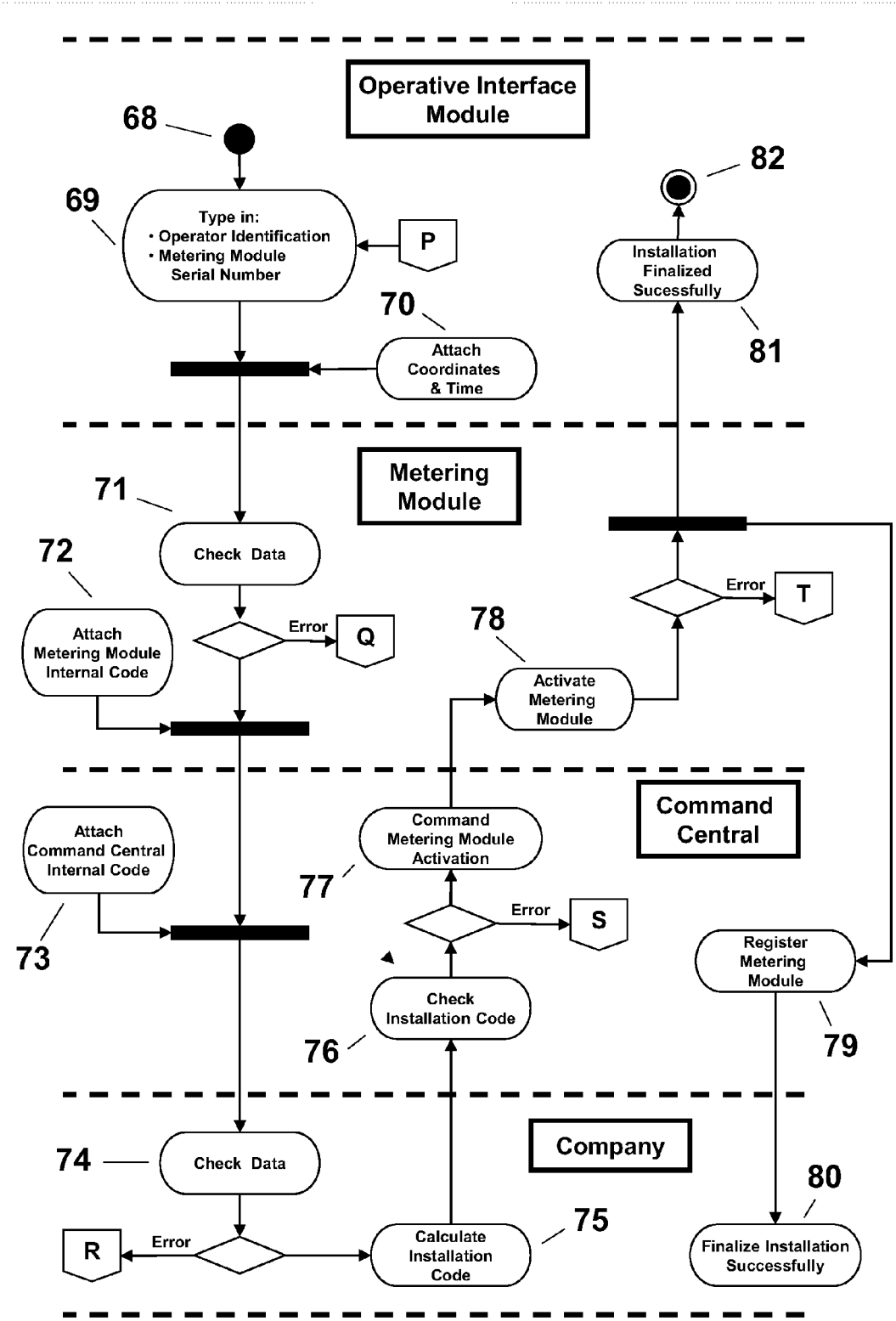
FIG. 10A: Flow diagram for the procedure of Metering Module Installation for Online configuration, when the Command Central has direct communication with the energy distribution company.

FIG. 10A illustrates, in a possible embodiment of the invention, a flow diagram for the Online Metering Module installation procedure in the "Method and System for Monitoring the Secondary Electric Power Distribution Grid with Detection of Fraud and Theft of Electric Energy and Public Lighting Diagnostics", object of the present invention, when the Command Central has direct communication with the Corporative Processing Center of the power company. The new installations to be made by this procedure may be done on a scheduled basis, wherein the data of the facilities to be performed are pre-loaded on the Operative Interface Module or can be made eventually when the company sends the new installation data using the module's external communication unit.

In order raise the level of security and guide the installation procedure, after the command to start the installation (68), an input procedure is required (69) via keyboard, or even barcode optical scanning or similar of the following data:

Operator Identification: that qualifies one operator or operators of a field team as legal responsible for the installation procedure. This systematic inhibits performing illegal procedures.

Metering Module serial number: that externally identifies the module being installed.

Figure 10B:
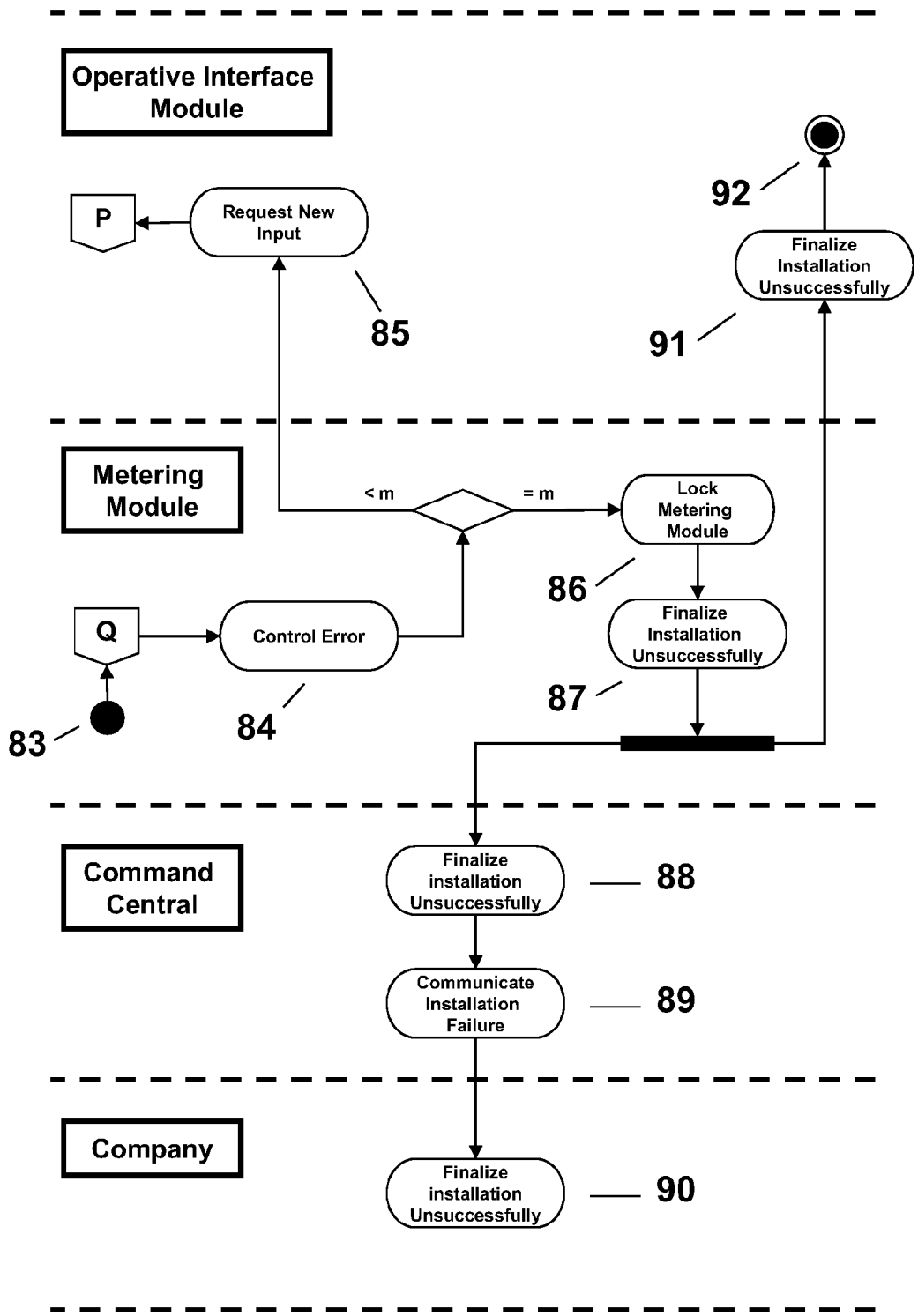
FIG. 10B: Flow diagram for the procedure of Metering Module Installation for Online configuration, when the Metering Module detects an error in the installation procedure (Error Q).

Allied to the identifiers listed above, the installation procedure, given the current technology and for greater security, may additionally use the installation time and site coordinates (70). Then, these data are transmitted to the Metering Module which checks them (71) and decides:

If there is an error, symbolized by "Q", this will be treated in the diagram shown in FIG. 10B.

There being no error, the internal code of the Metering Module is added to the verified data (72) and the dataset is sent to the Command Central.

Figure 10C:
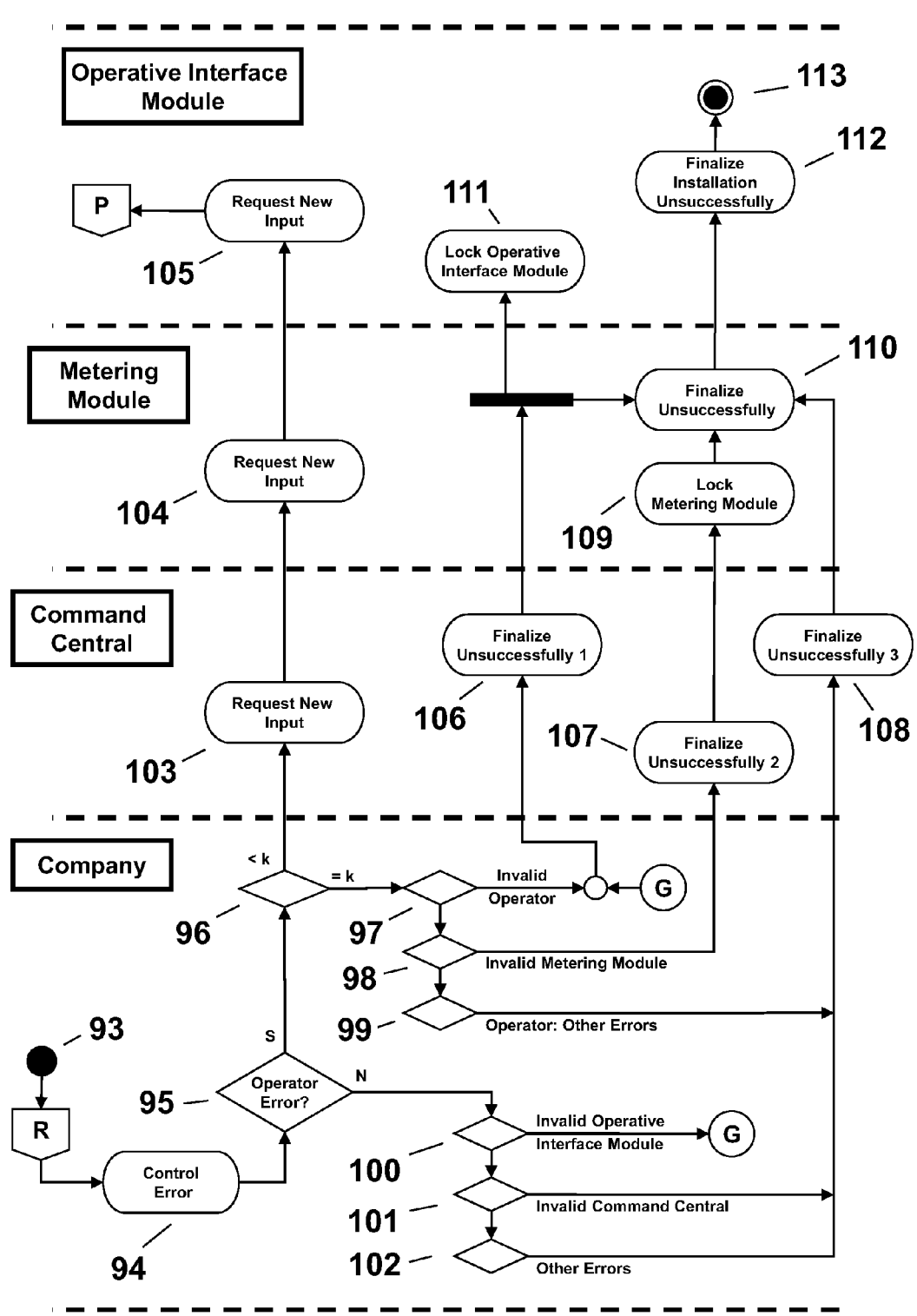
FIG. 10C: Flow diagram for the procedure of Metering Module Installation for Online configuration, when the Corporative Processing Center of the distribution company detects an error when checking data (Error R).

On the Command Central, the received data is appended with an internal code from the Command Central (73). The dataset is sent over external communication to the power company Corporative Processing Center (74) which checks them and decides:

If there is an error, symbolized by "R" in the diagram, this will be treated in the diagram shown in FIG. 10C.

There being no error, the validated data is used as seed for an installation code calculation (75) which will unequivocally characterize the installation procedure. This installation code is sent to the Command Central.

Figure 10D:
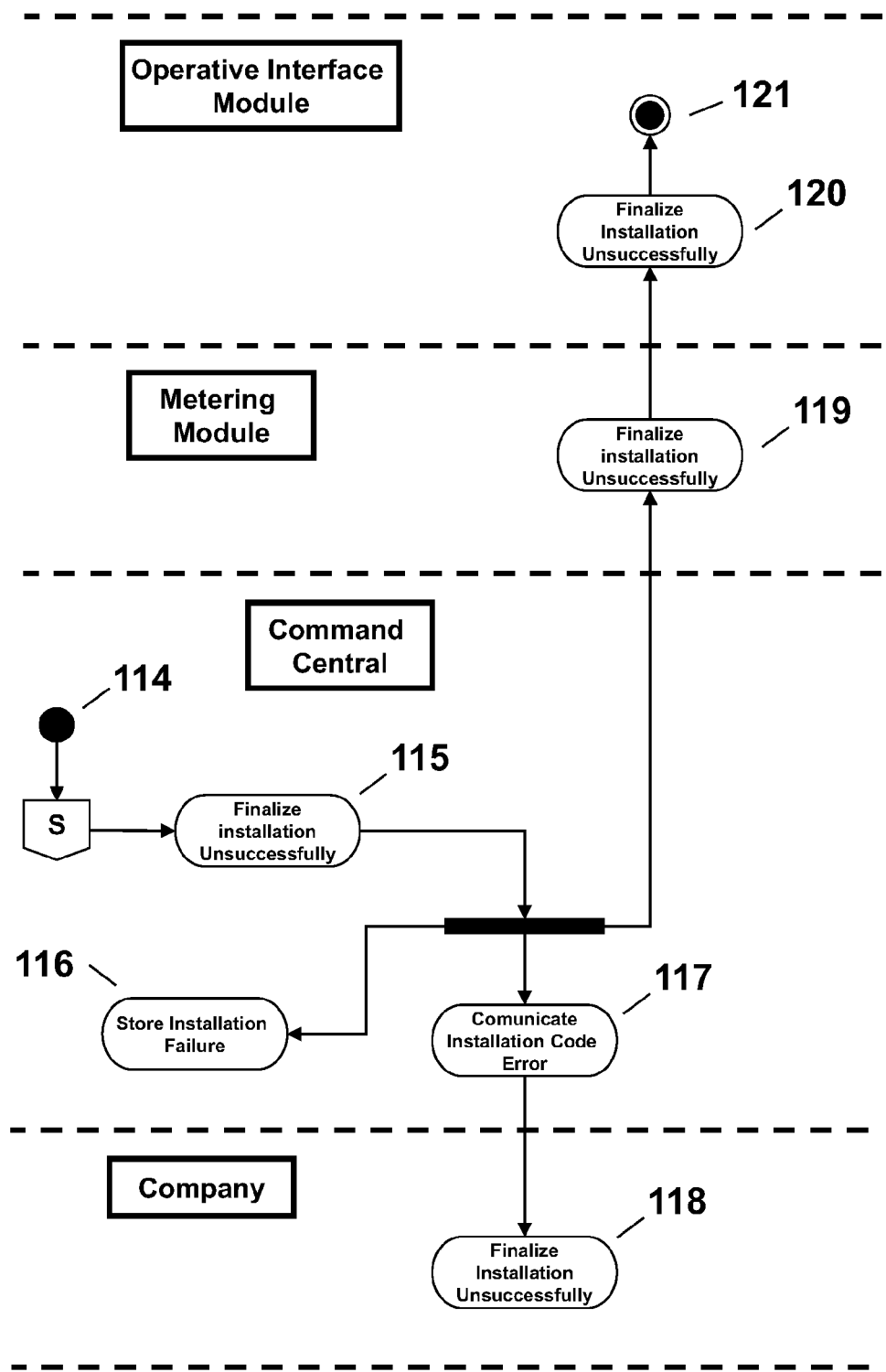
FIG. 10D: Flow diagram for the procedure of Metering Module Installation for Online configuration, when the Command Central detects an error in the installation code (Error S).

The Command Central verifies and validates the installation code received and decides:

If there is an error, symbolized by "S" in the diagram, this will be treated in the diagram shown in FIG. 10D.

There being no error, the Command Central sends a command signal for Metering Module activation (77).

Figure 10E:
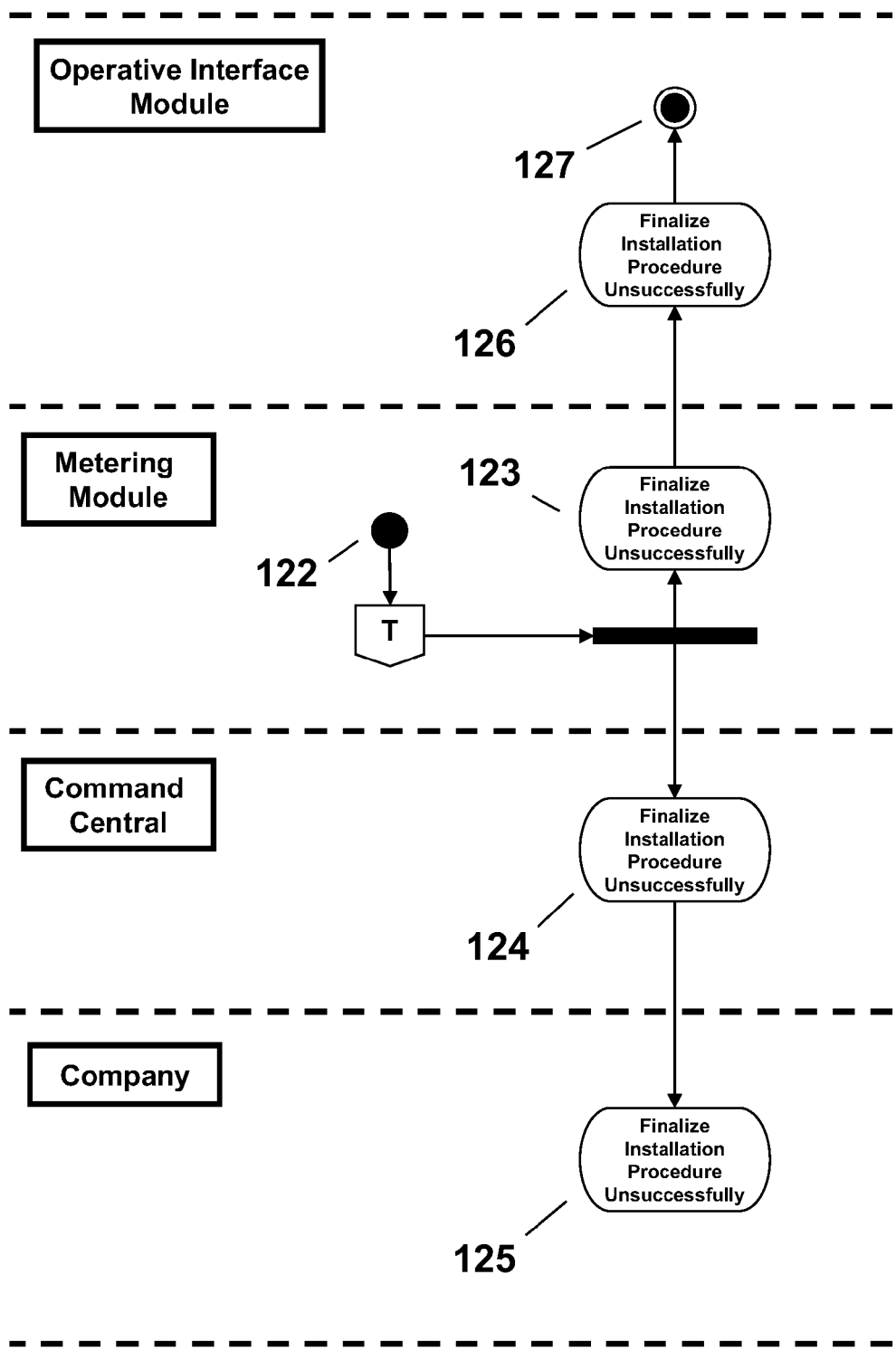
FIG. 10E: Flow diagram for the procedure of Metering Module Installation for Online configuration, when an error occurs in the Metering Module activation (Error T).

The Metering Module, when receives the activation signal, initializes the activation routine (78) which can have two results:

If there is an error, symbolized by "T" in the diagram, this will be treated in the diagram shown in FIG. 10E.

There being no error, the module sends a signal to the Operative Interface Module to finalize the installation procedure successfully. In parallel, a signal is sent to the Command Central who registers the Metering Module (79) and sends a data update (80) to the power company Corporative Processing Center.

Upon receiving the signal, the Operative Interface Module ends the installation procedure and signalizes its conclusion to the operator, finishing the diagram (81).

During data entry, the added information of time and geographical coordinates can serve the power company to verify the authorization of specific employee on the installation time and maximum distance to the distribution transformer, for example 500 meters, since the secondary circuits are not long. The operator can record the coordinates of the utility pole where the service drop (10) is connected to conciliation or registration of the utility pole and service drop in the company power network database. So the company can validate distances and also automatically update the power network database with the new client connection to the utility pole after the successful installation of the Metering Module.

FIG. 10B illustrates, in a possible embodiment of the present invention, a flow diagram for the Online Metering Module installation procedure in the "Method and System for Monitoring the Secondary Electric Power Distribution Grid with Detection of Fraud and Theft of Electric Energy and Public Lighting Diagnostics", object of the present invention, when the Metering Module detects error when checking data, denoted by "Q" (Error Q) on FIGS. 10A and 10B. After the error handling procedure start command (83) the Metering Module controls the error (84) counting:

If the result of the count is less than an integer value "m" a signal is sent to the Operative Interface Module requesting new input (85), which will continue in symbol "P" in FIG.

10A. In order to make it difficult to break into the system by the use of brute force techniques, each new input request can increase the temporal inertia of the system.

When the error count reaches the value "m", determined by the power company, a lock signal to the Metering Module is generated (86), followed by a signal for unsuccessful termination of the installation procedure (87) sent:

To the Command Central that stores the failure (88) and communicates (89) telemetrically to the power company Corporative Processing Center that logs the event (90) and take appropriate actions;

To the Operative Interface Module which displays the end of the installation procedure without success (91) and finishes this diagram (92).

FIG. 10C illustrates, in a possible embodiment of the invention, a flow diagram for the Metering Module installation procedure on the "Method and System for Monitoring the Secondary Electric Power Distribution Grid with Detection of Fraud and Theft of Electric Energy and Public Lighting Diagnostics", object of the present invention, when the power company Corporative Processing Center detects error when checking data, which in FIGS. 10A and 10C are symbolized by "R" (Error R). After the error handling procedure start command (93), the Corporative Processing Center controls the error count (94) in the following way:

If it is a mistake that can be made by the operator who is performing the installation and if the counting result is less than an integer value "k" established by the company, a signal is telemetrically sent requesting new operator input to the Command Central. Then, a signal requesting new input (103) is sent to the Metering Module. After processing, the Metering Module sends a signal requesting new input (104) to the Operative Interface Module that will be continued in the symbol "P" in FIG. 10A. In order to make it difficult to break into the system by the use of brute force techniques, each new typing request can increase the temporal inertia of the system.

If it is not a mistake that can be made by the operator who is making the installation:

Invalid Operative Interface Module (100): the module is not recognized by the company or do not have authorization for the procedure. A signal is sent to the Command Central to terminate unsuccessfully the installation, with the possibility to lock the Operative Interface Module.

Invalid Command Central (101): the internal identification number of the Command Central is not registered in the company. In this case, the company sends a signal to finish the installation procedure unsuccessfully (108).

Other errors (102): other internal check errors also indicate to the Command Central the completion of the installation procedure unsuccessfully (108).

If it is an error that can be made by the operator and the error count reaches the value "k":

Invalid operator (97): the operator code or identification is not recognized by the company or the operator is not in his work schedule. A signal is sent to the Command Central to terminate unsuccessfully the installation (106), with the possibility to lock the Operative Interface Module (111).

Invalid Metering Module (98): internal and external codes (serial number) are valid, but the company does not recognize the Metering Module in their records. In this case, the signal is sent to finish the installation procedure (107) also with the possibility to lock the Operative Interface Module (109).

Other operator errors (99): for example, trying to connect a client to the wrong transformer or in a coordinated considered invalid for the installation. In this case the installation procedure is completed with the possibility to block new attempts on this specific Operative Interface Module.

FIG. 10D illustrates, in a possible embodiment of the invention, a flow diagram for the Metering Module installation procedure on the "Method and System for Monitoring the Secondary Electric Power Distribution Grid with Detection of Fraud and Theft of Electric Energy and Public Lighting Diagnostics", object of the present invention, when the Central Command detects an error in the installation code, which in FIGS. 10A and 10D are symbolized by "S" (Error S). After receiving the installation code calculated and sent by the Corporative Processing Center, the Command Central verifies and validates the code. If the installation code is not correct, the Command Central initiates the error procedure (114) and commands the procedure termination without success (115):

Stores the data of this Metering Module installation procedure and the fault data (116);

Send to the Metering Module a signal to complete the installation without success (119). This, in turn, communicates with the Operative Interface Module to complete the procedure also unsuccessfully (120) and displays this result to the operator;

Reports the error to the Corporative Processing Center (117), so that the company can complete the procedure by registering the failure and taking appropriate actions (118).

FIG. 10E illustrates, in a possible embodiment of the invention, a flow diagram for the Metering Module installation procedure in the "Method and System for Monitoring the Secondary Electric Power Distribution Grid with Detection of Fraud and Theft of Electric Energy and Public Lighting Diagnostics", object of the present invention, when there is an error in the activation procedure of the Metering Module, which in FIGS. 10A and 10E is symbolized by "T" (Error T).

After the start command of the error handling procedure (122), the Metering Module terminates the installation procedure unsuccessfully (123) and passes this information to the Operative Interface Module and to the Command Central. The Operative Interface Module displays the unsuccessful installation procedure (126) and closes this diagram (127). Upon receiving information from the Metering Module, the Command Central ends the installation procedure without success (124) and communicates telemetrically to the Corporative Processing Center that also ends the installation procedure without success (125).

Figure 11A:
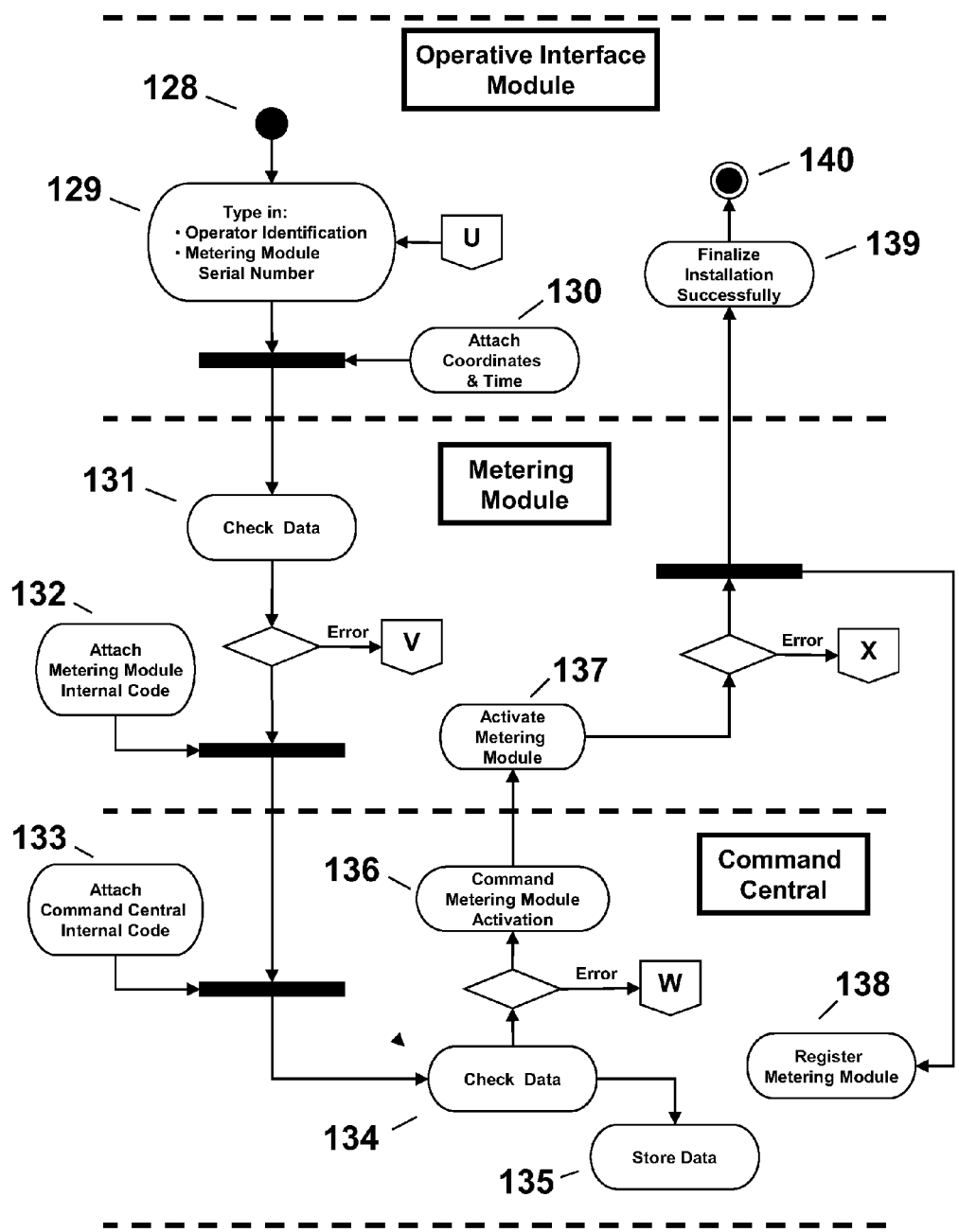
FIG. 11A: Flow diagram for the procedure of Metering Module Installation for Off-Line configuration, when the Command Central has no direct communication with the energy distribution company.

FIG. 11A illustrates, in a possible embodiment of the invention, a flow diagram for the Off-Line Metering Module installation procedure in the "Method and System for Monitoring the Secondary Electric Power Distribution Grid with Detection of Fraud and Theft of Electric Energy and Public Lighting Diagnostics", object of the present invention, when the Command Central does not communicate directly with the Corporative Processing Center of the utility company. The new client connections to be made by this procedure may be done on a scheduled basis, wherein the data of the facilities to be performed in the day are uploaded beforehand in the Operative Interface Module or can be made in an eventual basis, when the company sends the new installation data using the external communication of the Operative Interface Module.

After the installation procedure start command (128) an input is requested (129), via keyboard or even by optical reading in specific cases, in order to guide and raise the level of safety of the installation procedure:

Operator Identification: that qualifies only one operator as legal responsible for the installation procedure. The company can also choose to qualify the operators of a field team. This approach inhibits illegal installations of Metering Modules.

Metering Module serial number: that externally identifies the module to be installed.

Figure 11B:
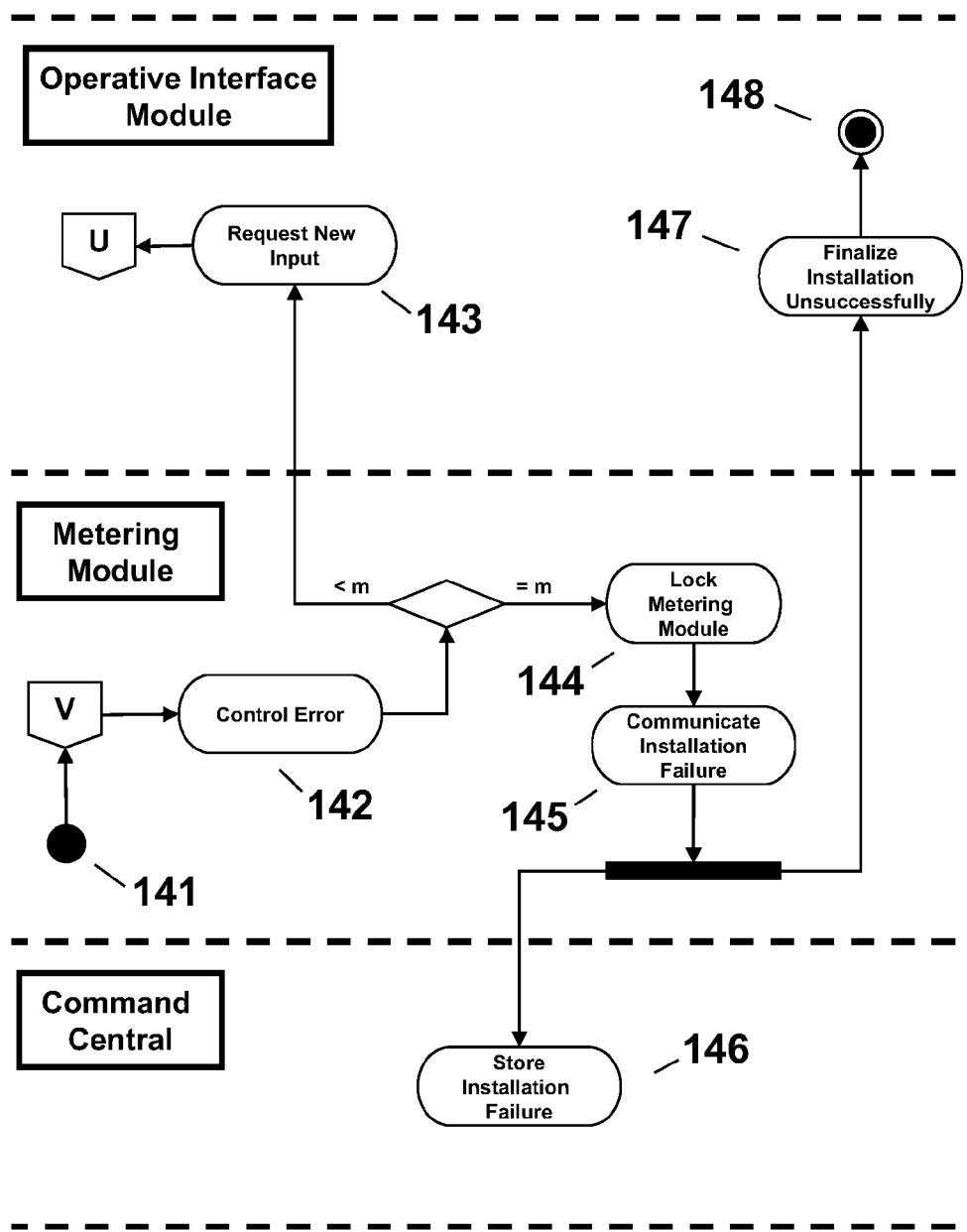
FIG. 11B: Flow diagram for the procedure of Metering Module Installation for Off-Line configuration, when the Metering Module detects an error in the installation procedure (Error V).

Allied to the identifiers listed above, the installation procedure, given the current technology and for greater security, additionally may register the time when it was initiated and the installation location coordinates (130). If the utility company has detailed records of the distribution network, the operator can also collect the utility pole coordinates from which stems the service drop, enabling later automatic update of distribution network databases. These data are transmitted to the Metering Module that checks the information (131) and decides:

If there is an error, symbolized by 'V', this is treated in the diagram shown in FIG. 11B.

If there is no error, the data validated in Metering Module is attached to the Metering Module internal code (132) and the result is sent to the Command Central.

At the Command Central, the received data is appended with its own internal code (133). In sequence, the Command Central checks (134) this dataset, saves (135) and decides:

If there is an error, symbolized by "W", this is treated in the diagram shown in FIG. 11B.

There being no error, the Command Central sends a command signal for Metering Module activation (136).

The Metering Module, receiving the activation signal, initiates the activation routine (137) that can present two results:

1. If there is an error, symbolized by "X", this will be treated in the diagram shown in FIG. 11D.

2. There being no error, the Metering Module sends a signal to the Operative Interface Module to finalize the installation procedure successfully (139). In parallel, a signal is sent to the Command Central that registers the new Metering Module (138).

Upon receiving the signal, the Operative Interface Module ends the installation procedure (139), ending the diagram (140).

In this procedure, in which there is no direct communication between the Command Central and Corporative Processing Center of the power company, all history data is accumulated in the Command Central. This register, within a particular frequency, is passed by telemetric means to the Operative Interface Module as illustrated in (5) in FIG. 1. Typically this transfer is done together with the monthly procedures for client consumption reading. Subsequently, the data accumulated in the Operative Interface Module are read, checked and stored at the Corporative Processing Center. If there is any abnormality, such as fraud or theft of energy or inconsistencies in procedures recorded in history, as the errors described below and depicted in FIGS. 11B, 11C and 11D, the company can take appropriate action and send technicians to survey or inspect the circuit.

FIG. 11B illustrates, in a possible embodiment of the invention, a flow diagram for the Off-Line Metering Module installation procedure in the "Method and System for Monitoring the Secondary Electric Power Distribution Grid with Detection of Fraud and Theft of Electric Energy and Public Lighting Diagnostics", object of the present invention, when the Metering Module detects an error when checking data, symbolized by "V" (Error V) in FIGS. 11A and 11B. After the start command of the error handling procedure (141), the Metering Module controls the error counting (142):

If the count result is less than an integer value "m" a signal is sent to the Operative Interface Module requesting a new input (143) which will continue at symbol "U" in FIG. 11A. To make it difficult to break into the system by the use of brute force techniques, each new input request can increase the temporal inertia of the system.

When the error count reaches the value "m" a signal to lock the Metering Module is generated (114) and as a result, an installation procedure fault signal (145) is sent:

To the Command Central, that stores the failure (146);

To the Operative Interface Module, that displays the end of the installation procedure without success (147) and closes this diagram (148).

Figure 11C:
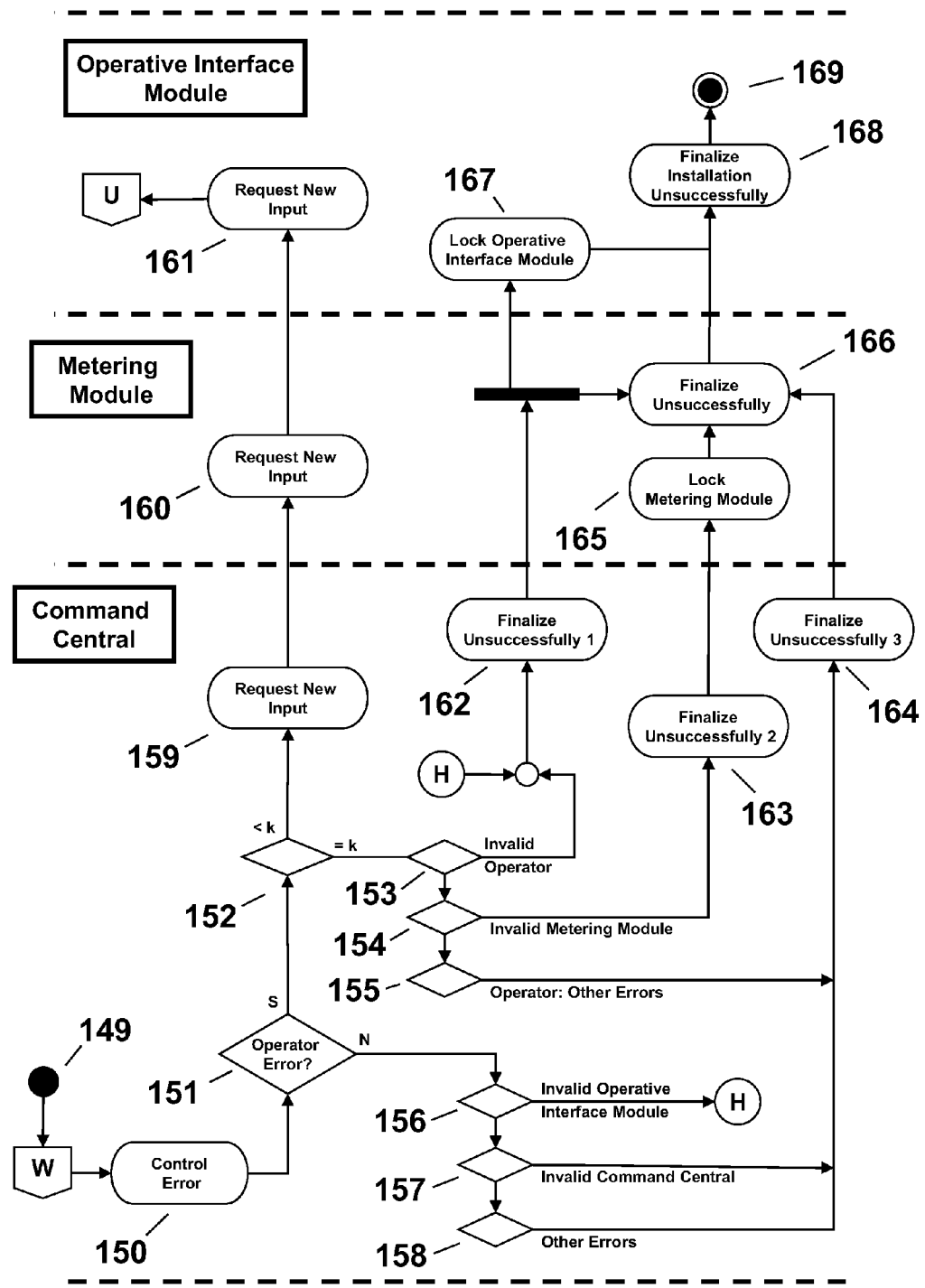
FIG. 11C: Flow diagram for the procedure of Metering Module Installation for Off-Line configuration, when the Command Central detects an error when checking data (Error W).

FIG. 11C illustrates, in a possible embodiment of the invention, a flow diagram for the Off-Line Metering Module installation procedure in the "Method and System for Monitoring the Secondary Electric Power Distribution Grid with Detection of Fraud and Theft of Electric Energy and Public Lighting Diagnostics", object of the present invention, when the Command Central detects an error when checking data, which in FIGS. 11A and 11C is symbolized by "W" (Error W). After the start command of the error handling procedure (149), the Corporative Processing Center of the company controls the error counting (150):

If it is an error that can be made by the operator that is doing the connection and if the result of the count is less than an integer value "k", established by the company, a signal requesting a new input is sent to the Metering Module (159), which in turn sends the signal to the Operative Interface Module (160), continuing at the symbols "U" in FIG. 11A. To make it difficult to break into the system by the use of brute force techniques, each new input request can increase the temporal inertia of the system.

If it is not an error that can be made by the operator that is making the connection:

Invalid Operative Interface Module (156): the module is not recognized by the company. A signal is sent to the Command Central to terminate unsuccessfully the installation, with the possibility of commanding the lock of the Operative Interface Module.

Invalid Command Central (157): the internal identification number of the Command Central is not a valid number recognized by the company. In this case, the Command Central sends a signal to end the installation procedure unsuccessfully (164).

Other errors (158): other internal check errors also signal the completion of the installation procedure unsuccessfully (164).

If an error that can be made by the operator and the error count reaches the value "k":

Invalid Operator (153): the operator code is not recognized by the company or is not a valid working time. It is sent a signal to the Metering Module to terminate unsuccessfully the installation (162) with the possibility of commanding the lock of the Operative Interface Module (167);

Invalid Metering Module (154): internal or external code (serial number) is not a valid code for the company. In this case, a signal is sent to terminate the installation procedure (163) also with the possibility of locking the Metering Module (165);

Other operator errors (155): for example, trying to install a client on the wrong transformer or in a coordinated considered invalid for the service. In this case the installation procedure is terminated (164), (166) and (168) with the possibility of blocking this specific installation in the Operative Interface Module.

Figure 11D:
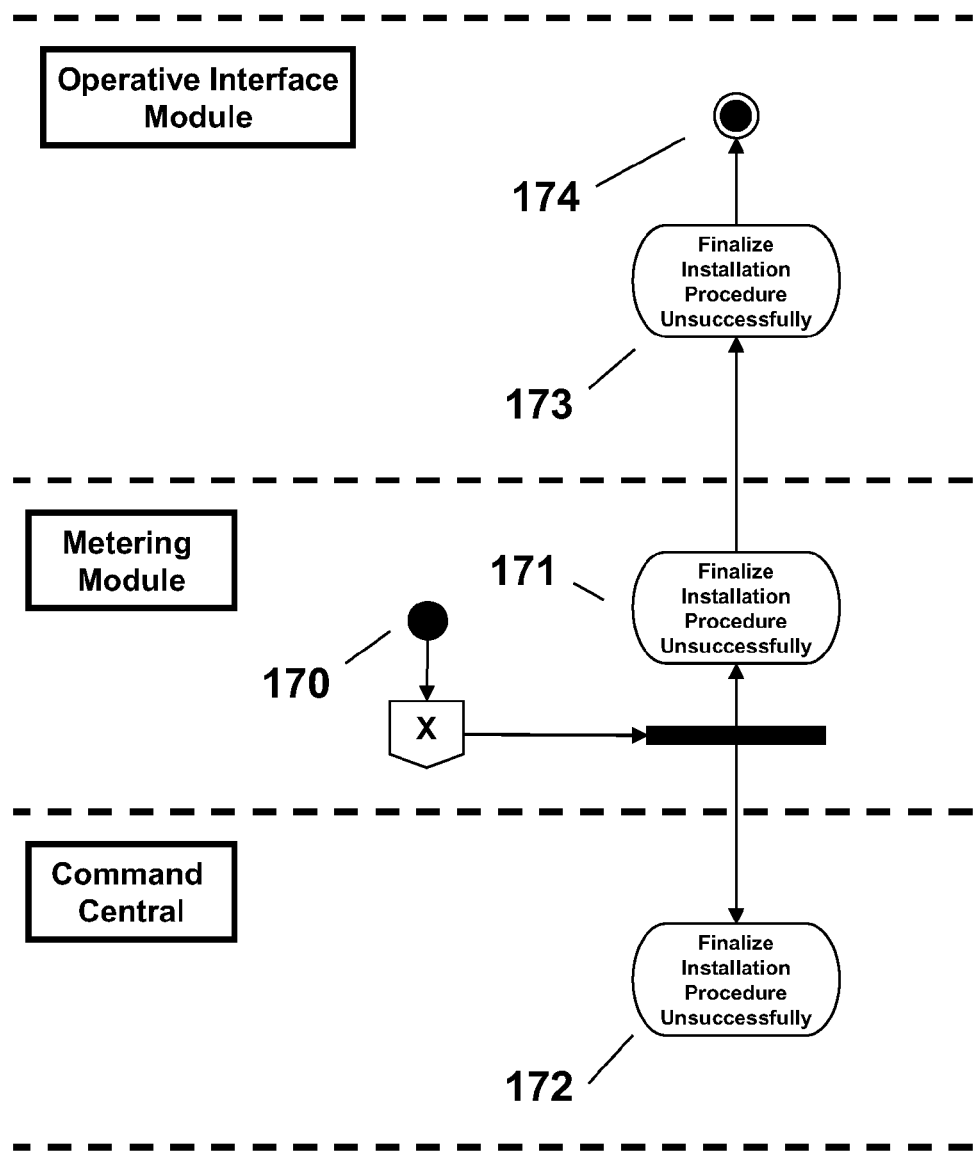
FIG. 11D: Flow diagram for the procedure of Metering Module Installation for Off-Line configuration, when an error occurs in Metering Module activation (Error X).

FIG. 11D illustrates, in a possible embodiment of the invention, a flow diagram for the Off-Line Metering Module installation procedure in the "Method and System for Monitoring the Secondary Electric Power Distribution Grid with Detection of Fraud and Theft of Electric Energy and Public Lighting Diagnostics", object of the present invention, when there is an error in the activation procedure of the Metering Module, that in FIGS. 11A and 11D is symbolized by "X" (Error X). After the start command of the error handling procedure (170), the Metering Module terminates the installation procedure unsuccessfully (171) and passes this information to the Operative Interface Module and to the Command Central. The Operative Interface Module signals the unsuccessful installation procedure (173) and closes this diagram (174). Upon receiving information from the Metering Module, the Command Central terminates the installation procedure unsuccessfully (172).

For the Metering Module removal procedure, for example, when there is the disabling of a client unit in a demolition, the procedure is quite straightforward:

The Operative Interface Module is loaded with the address data, Metering Module identification, Command Central identification and operator or authorized personnel data;

Attached to the Metering Module, the Operative Interface Module communicates with the Metering Module and the Command Central, initiating the process;

The Metering Module transfers the relevant data to the Command Central and Operative Interface Module;

The Command Central executes its internal routine to remove the Metering Module and, if there is direct communication with the Corporative Processing Center of the company, announces the operation;

The Metering Module communicates the success of the operation to the Operative Interface Module and automatically shuts off itself.

The Metering Module substitution procedure runs sequentially as the removal procedure followed by the installation procedure.

For the Metering Module disposal procedure, for example, in the case of internal failure, the company must log the record of disposal in their databases.

Figure 12:
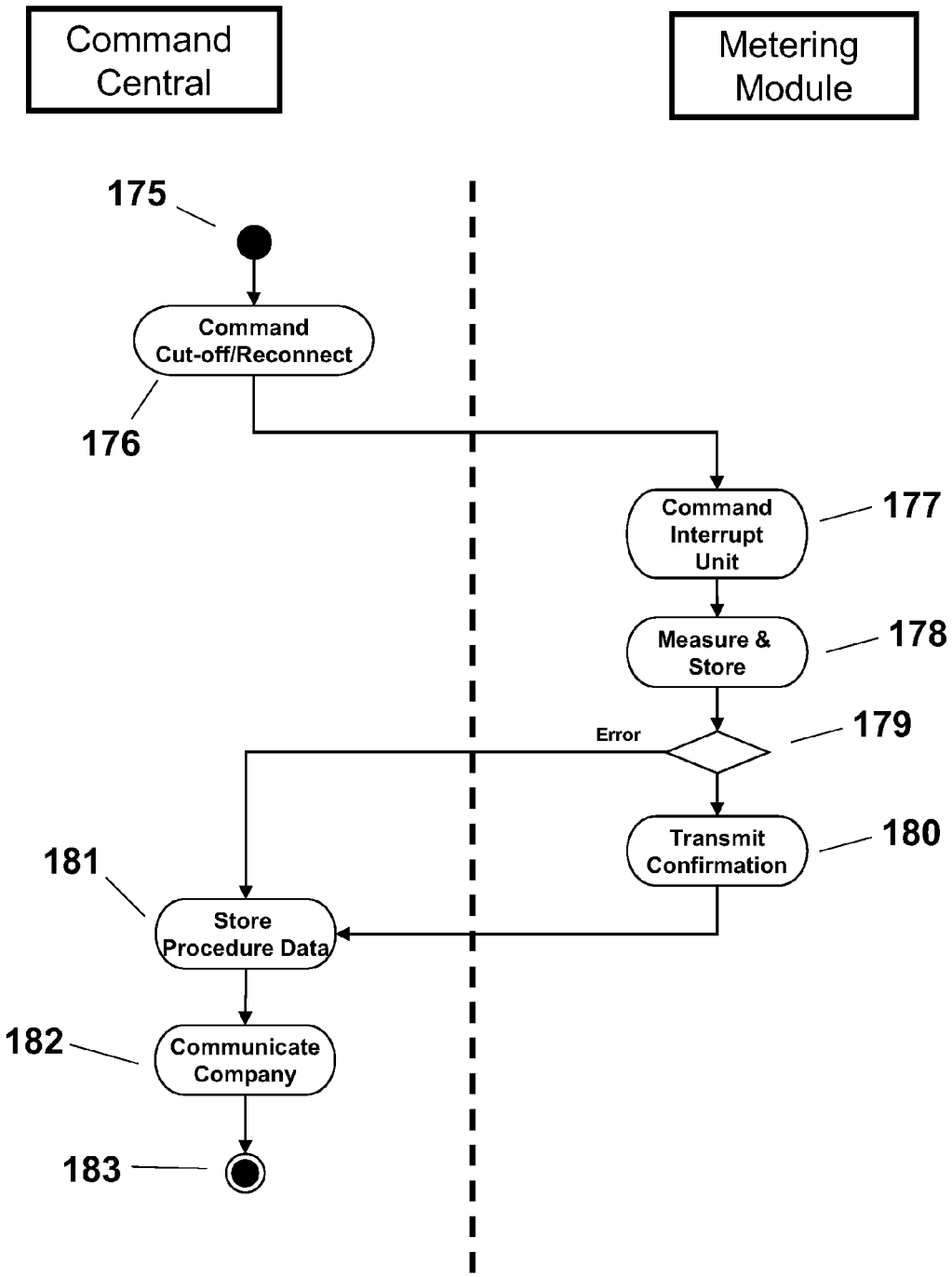
FIG. 12: Flow diagram for the procedure of power cut-off and reconnection of client unit.

The procedure for cut-off and reconnection of electricity supply to client's consuming unit is illustrated by the flow diagram in FIG. 12. These procedures are usually employed in cases of debit account with the power company, in accordance with current legislation. When there is debt referring to the payment of energy bills and after the client has been advised by the duration and number of times specified by law, the power company may cut-off the power supply to the consuming unit. Likewise, after the client has paid off the debt, the company performs the reconnection of the consuming unit.

The warnings of debit and cut-off can be shipped directly to the client via the Display Module, simplifying the warnings process. Likewise, after reconnection, the power company may send information such as the effective reconnection time.

The cut-off and reconnection procedures are similar:

The Corporative Processing Center of the company sends the cut-off/reconnect command to the Command Central on which is registered the involved consuming unit (when there is direct communication with the company);

The Command Central sends the cut-off/reconnect command to the Metering Module involved (176);

The Metering Module performs electronically the on/off switching of the Interrupt Unit (177);

To confirm the operation, the Metering Module performs current and voltage measurements and records the event on its Storage Unit (178);

If measurements detects any error in the procedure, a signal error is sent (179) to the Command Central;

If the procedure is successful, the Metering Module sends the execution confirmation to the Command Central (180);

The Command Central stores the data of the cut-off/reconnect in its storage unit (181); and Sends the execution confirmation and procedure outcome to the Corporative Processing Center (when there is direct communication with the company) (182).

In cases where there is no direct communication between the Corporative Processing Center and Command Central, an Operative Interface Module must be loaded with cut-offs/reconnections data and taken to the Command Central by an authorized operator to perform the transmission of commands using the local communication interface.

As in other cases where there is no direct communication with the Corporative Processing Center, operators can use any Metering Module for sending commands to the Command Central.

Communication commands and confirmations should be encrypted and have time validation ("time out") and other checks with appropriate error treatments for improved system reliability.

Figure 13:
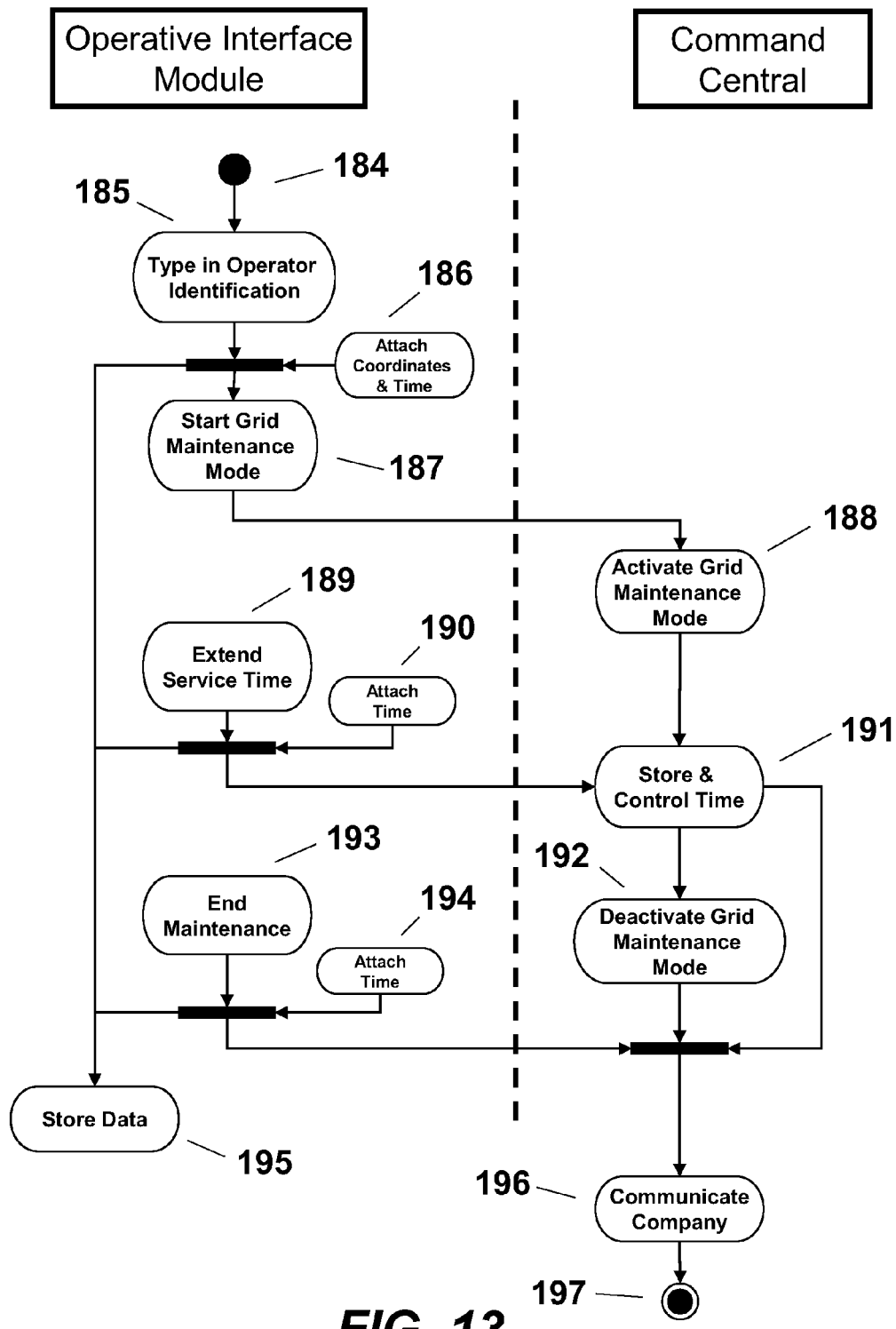
FIG. 13: Flow diagram for the procedure of energized secondary distribution network maintenance.

The procedure to be used for Maintenance of the Secondary Network, depicted in FIG. 13, applies to live-line team maintenance where the secondary circuit remains energized during service. This is necessary because, during the service, there may be miscommunication with Metering Modules during the service by partial circuit shutdown made by the staff. In a possible embodiment, this procedure can be as following:

The power company sends the warning and maintenance service data both to the maintenance staff and to their Operative Interface Module;

The operator identifies himself (185) and uses the Operative Interface Module to command the Command Central into grid maintenance mode (187). Communication can be made directly to the Command Central or through any Metering Module of the secondary circuit. In grid maintenance mode (188), the Command Central continues operating and communicating, but does not perform commands for communicating with Metering Modules, such as consumption readings and control measurements;

Each service has a maximum authorization time (191), and a responsible operator, authenticated and authorized for its execution;

After expired the service authorization time, the Command Central returns to normal operation (192);

The staff can command an extension of the allotted time for the maintenance service (189) or communicate the finishing of the service before the authorized time (193), always by an identification key of the authorized operator for the service in execution, through the Operative Interface Module;

The Command Central stores the history of maintenance (195).

In cases where there is direct communication with the power company, all maintenance commands received by the Command Central are sent to the Corporative Processing Center (196). When there is no communication, all the stored services data are transmitted to the Operative Interface Module when is established an authorized connection during any operative procedure in the circuit.

Figure 14:
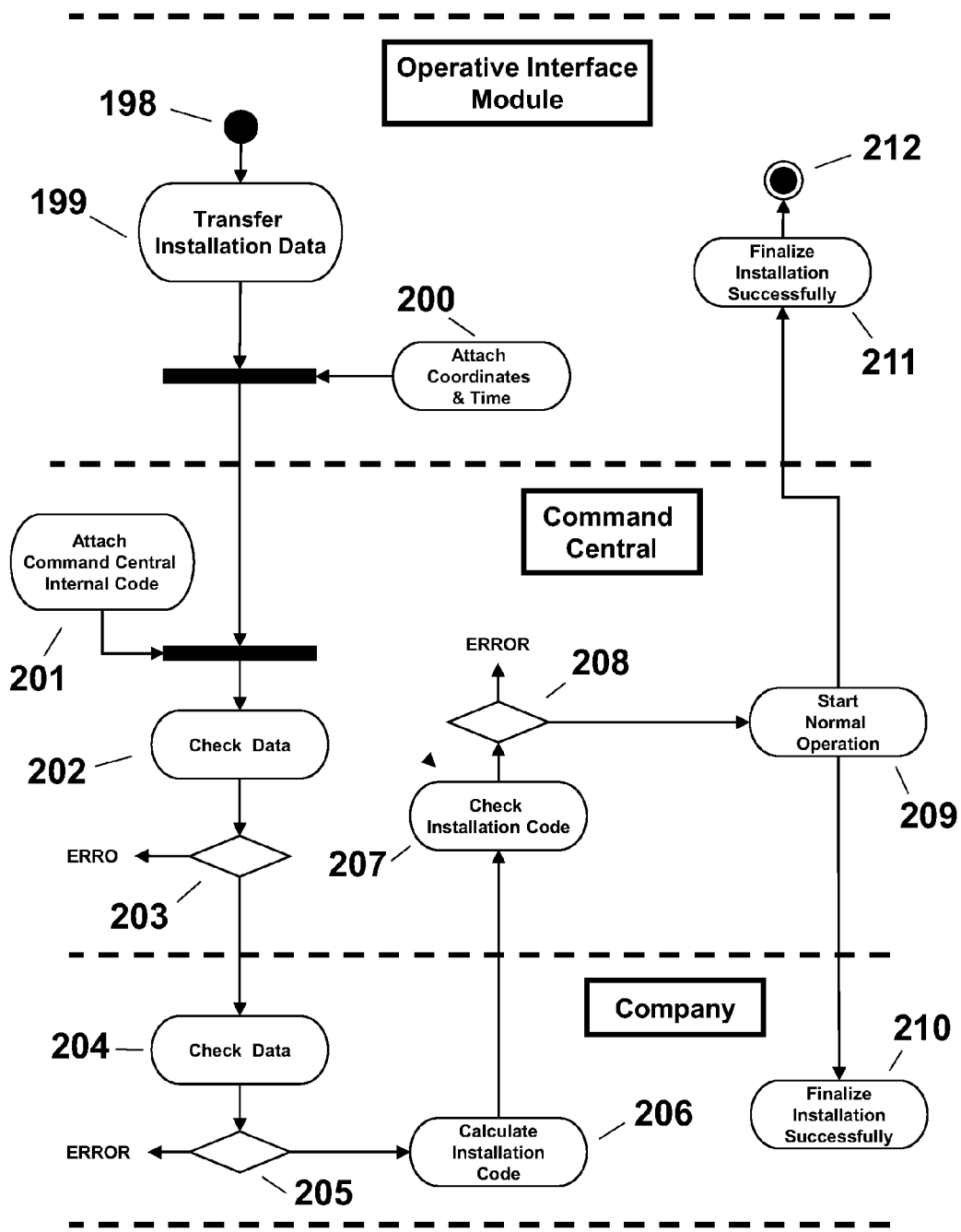
FIG. 14: Flow diagram for the procedure Command Central installation for Online configuration.

The Command Central installation procedure is illustrated in FIG. 14 and considers that there is no Metering Modules installed in the secondary circuit of the transformer:

- The Corporative Processing Center sends, or loads in the Operative Interface Module, the transformer data and installation coordinates, address and authorized operator;
- After installation and the Command Central being energized, the installation data in the Operative Interface Module is transferred to the Command Central (199), along with the coordinates and installation time (200);
- The data are verified locally (202);
- If there is direct communication with the Corporative Processing Center, installation data are sent to the company that checks and validates them a second time (204);
- The Corporative Processing Center calculates and sends an installation validation code (206) to the Command Central that checks this code (207) and starts normal operation (209), indicating the success of the procedure to the Operative Interface Module (211) and to the Corporative Processing Center (210);
- If there is no direct communication, the installation data are stored in the Operative Interface Module for verification and subsequent update of corporate databases.

The error cases in decisions (203), (205) and (208) are treated similarly to previous procedures and can be summarized in requesting again the operator's identification and invalidating the entire installation procedure.

A possible implementation of the procedure for removal of the Command Central, in case the equipment is in normal operation, can be described by the following steps:

- The Corporative Processing Center sends, or loads the Operative Interface Module with the data for the Command Central removal, as the transformer number, installation coordinates, address and authorized operator.
- The Operative Interface Module establishes local communication with the Command Central and both validate the removal operation.
- The Command Central unloads all its stored data to the Operative Interface Module. Optionally, it can simultaneously validate the operation and send its stored data to the company if there is direct communication with the Corporative Processing Center.
- The Command Central announces in broadcast its shutdown to the Metering Modules.
- The Command Central terminates its functions.

At this point the Command Central can be electrically disconnected and removed from the distribution network.

If the Command Central is not working properly, the removal is made without control data, but the procedure should be administratively reconciled, indicating the removal to the corporate systems, as Corporative Processing Central would continue accusing the lack of communication with the Command Central. The defective equipment should be forwarded to a laboratory so that the stored data, if any, can be recovered and incorporated into corporate databases.

The Command Central substitution procedure has two possibilities, depending on the equipment being or not in normal operation. The substitution operation can be due, for instance, to exchange for a more modern or new equipment with more features.

In this case there will usually be Metering Modules installed and running in the secondary circuit.

The first phase of the substitution procedure is similar to the Command Central removal, except for the addition of a new step, in the case of a working Command Central, of consistency checking the data from all Metering Modules installed in the secondary circuit, made by the Operative Interface Module and/or Corporative Processing Center.

After installing the new Command Central, all installation data present in the Operative Interface Module is transferred to it. A scan is performed in all Metering Modules, retrieving the information stored in each of them and a report is generated and transmitted to the Operative Interface Module and to the Corporative Processing Center.

In case of power failure in the secondary distribution network, when the power is restored, the Command Central performs a self-test check on its circuits and then on each of the registered Metering Modules. If the verification is successful, normal operation resumes.

If there is direct communication with the Corporative Processing Center, one possibility to increase the system functionality is the use of batteries in the Command Central, enabling a temporary communication continuity with the company in case of power failure and thus a reduction in the acknowledge time of distribution network problems and the total repair time, improving the services quality and increasing the power system reliability.

Thus, sorting network faults can be implemented because all transformers affected by power outage are detected, allowing an analysis of the network and giving much more accurate detection of the operated equipment in the primary network. For this, all transformers belonging to the same de-energized primary network extension are grouped, following the route of the primary network to the first upstream protective equipment and so on.

The invention claimed is:

1. Method for monitoring the secondary electric power distribution grid with detection of fraud and energy theft and public lighting diagnostics in the secondary power distribution grid, the secondary power distribution grid comprising:

A Command Central (2) located at a secondary busbar (17) at a distribution transformer (1) of the secondary power distribution grid, the Command Central (2) comprising functions of supervision, measurement and control, At least one Metering Module (11) installed at the energy entry point at each of a plurality of client installations (14) along the secondary electric power distribution grid which measures electrical parameters of a corresponding load (13) of the client installation (14), wherein the Metering Modules (11) communicate with Command Central (2), the method comprising:
a) Measuring, by the Command Central, the phasors of electrical parameters of current and voltage or its derivatives, of the secondary electric power distribution grid, where the said measuring includes clients' loads, public lighting loads, electrical losses and eventual theft and fraud loads; and
b) Simultaneous measuring, by the Metering Modules, at each client installation of the secondary electric power distribution grid, the respective phasors of current and voltage electrical parameters or its derivatives, where the said measuring includes client's load and eventual fraud loads,
c) Calculating a phasor sum of all measured by the Metering Modules, and adding to the calculated phasor sum, calculated phasors of current or power reflecting registered public lighting loads and calculated or estimated electrical losses in the secondary electric power distribution grid, thereby obtaining a modified phasor sum, and d) Comparing a phasor measured by the Command Central with the corresponding modified phasor sum, resulting at least in:
   detection of fraud and energy theft; and
   diagnostics of the status of the public lighting,
   at the secondary grid of networks from energy distribution companies.

2. The method of claim 1 characterized by the use of simultaneous measurements at the Command Central (2) and at the Metering Modules (11) using the voltage waveform as reference.

3. The method of claim 2 characterized by the use of simultaneous measurements at the Command Central (2) and at the Metering Modules (11) using the number of cycles of the voltage waveform as reference.

4. The method of claim 2 characterized by the use of simultaneous measurements at the Command Central (2) and at the Metering Modules (11) using the voltage waveform zero-crossing as reference.

5. The method of claim 1 characterized by the use of simultaneous measurements at the Command Central (2) and at the Metering Modules (11) using an internal clock for direct time counting, synchronized from a signal or a specific command issued by the Command Central (2) or by the Corporative Processing Center (16) or by an operator through the Operative Interface Module (15).

6. System for monitoring the secondary electric power distribution grid with detection of fraud and energy theft and public lighting diagnostics in the secondary power distribution grid, according to the method defined in claim 1, characterized by:
   a) A Command Central (2) with functions of supervision, measurement and control, located at the secondary busbar (17) of the distribution transformer (1), that establishes communication with Metering Modules (11), Display Module (12), Operative Interface Module (15) and Corporative Processing Center (16);
   b) Metering Modules (11) installed at the energy entry point of each client installation (14), that measures the said client's load (13) electrical parameters and communicate with the Command Central (2), Display Module (12) and Operative Interface Module (15); and
   c) Operative Interface Module (15) used as an operator's communication media to inform, verify and assure the legitimacy of the activities of installation, removal, substitution and off-line data reading of the present system.

7. The system of claim 6, characterized by control measurements to detect fraud and energy theft or monitoring the public lighting, made simultaneously by the Metering Modules (11) and by the Central Command (2), synchronized from a specific command issued by the Command Central (2) or by the Corporative Processing Center (16) or by an operator through the Operative Interface Module (15).

8. The system of claim 6, characterized by the use of an Operative Interface Module (15) that:
   a) Has input and output capabilities to thereby allow data conciliation between Metering Modules (11), Command Central (2) and Corporative Processing Center (16);
   b) Is used as an interface device for activities of installation, removal, substitution and off-line reading of system's devices; and
   c) Is used to reinforce the security procedures of the present system.

9. The system of claim 8, characterized by the Operative Interface Module (15) being used as an operator's communication media to inform, verify and ensure the validity and legitimacy of the activities of installation, removal, substitution and off-line data reading of system's devices.

10. The system of claim 6, characterized by one or more Switching Unit (19) located at the Command Central (2) or in other points of the secondary grid, which allows no-load or low load opening operation, allowing the interruption of the Secondary Grid (9) after the opening operation of the Interrupter Unit (26) of the Metering Modules (11) said Metering Modules (11) having its electric energy supplied by said Switching Unit (19).

* * * * *